United States Patent
Yoon et al.

(10) Patent No.: US 8,264,018 B2
(45) Date of Patent: Sep. 11, 2012

(54) SEMICONDUCTOR MEMORY DEVICE

(75) Inventors: Hong Sik Yoon, Seongnam-si (KR); Jinshi Zhao, Seoul (KR); Ingyu Baek, Seoul (KR); Hyun Jun Sim, Hwaseong-si (KR); Minyoung Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 309 days.

(21) Appl. No.: 12/777,683

(22) Filed: May 11, 2010

(65) Prior Publication Data

US 2010/0289084 A1    Nov. 18, 2010

(30) Foreign Application Priority Data

May 15, 2009   (KR) .................. 10-2009-0042695

(51) Int. Cl.
*H01L 29/80* (2006.01)
(52) U.S. Cl. ... 257/278; 257/74; 257/302; 257/E21.629; 257/E27.084
(58) Field of Classification Search .................. 257/74, 257/278, E21.629
See application file for complete search history.

(56) References Cited

U.S. PATENT DOCUMENTS

| | | | |
|---|---|---|---|
| 6,643,159 B2 | 11/2003 | Fricke et al. | |
| 6,858,883 B2 | 2/2005 | Fricke et al. | |
| 7,205,598 B2 | 4/2007 | Voshell et al. | |
| 7,359,226 B2 | 4/2008 | Schwerin | |
| 2005/0230724 A1 | 10/2005 | Hsu | |
| 2007/0082448 A1* | 4/2007 | Kim et al. | 438/268 |
| 2007/0284623 A1* | 12/2007 | Kim et al. | 257/213 |
| 2008/0112209 A1 | 5/2008 | Cho et al. | |
| 2009/0291551 A1* | 11/2009 | Cho | 438/585 |

FOREIGN PATENT DOCUMENTS

| | | |
|---|---|---|
| JP | 2003-229537 | 8/2003 |
| JP | 311322 | 11/2005 |
| JP | 2007-149170 | 6/2007 |
| KR | 100827697 | 4/2008 |

* cited by examiner

*Primary Examiner* — Daniel Whalen
(74) *Attorney, Agent, or Firm* — F. Chau & Associates, LLC

(57) ABSTRACT

Provided is a semiconductor memory device. The semiconductor memory device may include a local bitline extending in a direction substantially vertical to an upper surface of a semiconductor substrate and a local wordline intersecting the local bitline. The local bitline is electrically connected to a bitline channel pillar penetrating a gate of a bitline transistor, and the local wordline is electrically connected to a wordline channel pillar penetrating a gate of a wordline transistor.

18 Claims, 23 Drawing Sheets

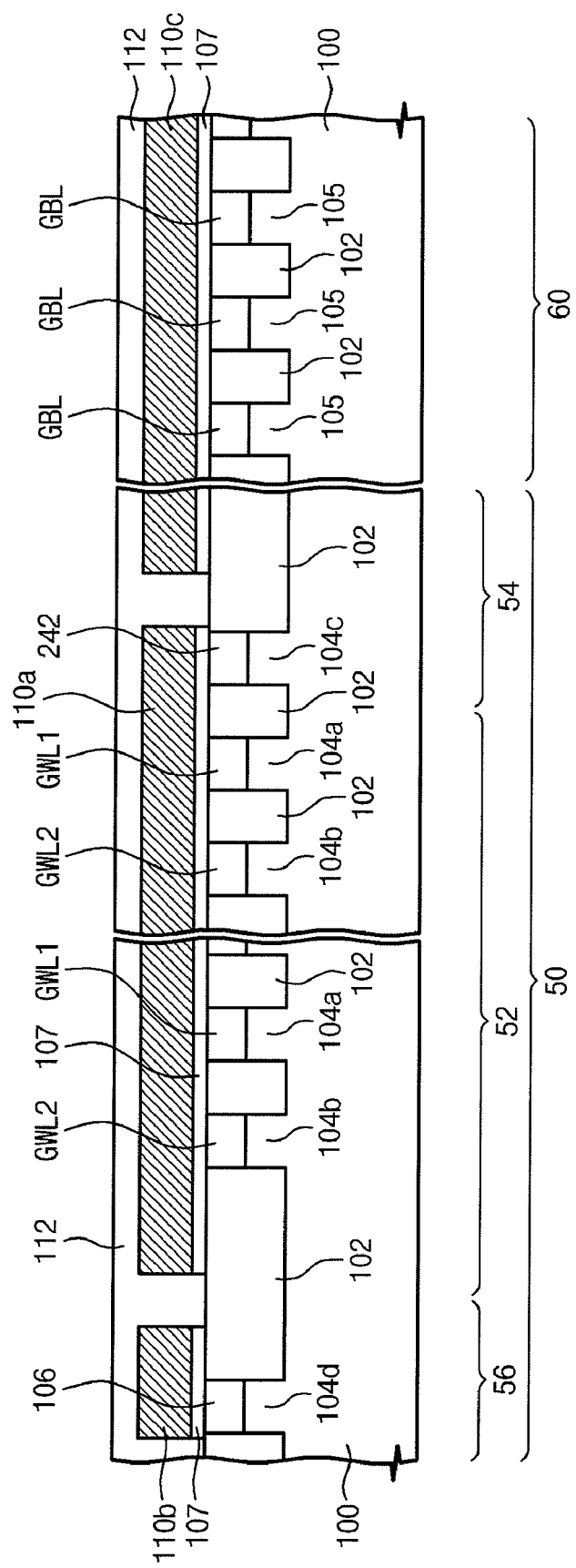

SEMICONDUCTOR MEMORY DEVICE

CROSS-REFERENCE TO RELATED APPLICATIONS

This U.S. non-provisional patent application claims priority under 35 U.S.C. §119 of Korean Patent Application 10-2009-0042695, filed on May 15, 2009, the entire contents of which are hereby incorporated by reference.

BACKGROUND

The present disclosure herein relates to a semiconductor device and, more particularly, to a semiconductor memory device.

Generally, semiconductor memory devices may store digital data. As electronic industries and semiconductor industries develop to a high degree, demand for high integration of the semiconductor memory devices has gradually increased. With the development of electronic equipment such as laptop computers, cellular phones, digital cameras, or MP3 players, the semiconductor memory devices have been required to store larger amounts of data.

Semiconductor memory devices may be highly integrated by shortening a minimum line width of fine patterns forming devices. By two-dimensionally shortening the minimum line width of the fine patterns, it is possible to integrate many memory cells in a limited area. However, there is a limit to methods of shortening the minimum line width due to various factors (for example, limit of photolithography process). For this reason, developments have actively been made on alternative methods to highly integrate semiconductor memory devices.

SUMMARY

The present disclosure provides a semiconductor memory device optimized to high integration.

The present disclosure also provides a semiconductor memory device having a three-dimensional structure optimized for high integration.

The present disclosure also provides a semiconductor memory device that is optimized for high integration and being effectively driven Embodiments of the inventive concept provide a semiconductor memory device including: a gate of a first wordline transistor disposed in a first region of a semiconductor substrate; a gate of a bitline transistor disposed in a second region of the semiconductor substrate; at least one first wordline channel pillar penetrating the gate of the first wordline transistor and insulated from the gate of the first wordline transistor; at least one bitline channel pillar penetrating the gate of the bitline transistor and insulated from the gate of the bitline transistor; a local bitline extending in a first direction substantially vertical to an upper surface of the semiconductor substrate and electrically connected to an upper surface of the bitline channel pillar; a first local wordline disposed at one side of the local bitline, extending in a second direction substantially perpendicular to the first direction so as to intersect the local bitline, and electrically connected to an upper surface of the first wordline channel pillar; and a first memory cell formed at an intersection between the local bitline and the first local wordline.

In some embodiments, the gate of the bitline transistor may be coupled to the gate of the first wordline transistor, such that the gate of the bitline transistor and the gate of the first wordline transistor may be controlled by one block selection signal.

In other embodiments, the semiconductor memory device may further include: a gate of a bias transistor disposed in the first region; at least one bias channel pillar penetrating the gate of the bias transistor and insulated from the gate of the bias transistor; and a bias line coupled to a lower surface of the bias channel pillar. In this case, the gate of the bias transistor may be coupled to the gate of the first wordline transistor, and the gate of the bitline transistor may be electrically connected to an upper surface of the bias channel pillar.

In still other embodiments, the bias line may be formed in a bias active portion defined in the semiconductor substrate below the gate of the bias transistor and the bias line may be doped with dopants.

In even other embodiments, the semiconductor memory device may further include: a gate of a second wordline transistor disposed in the first region; at least one second wordline channel pillar penetrating the gate of the second wordline transistor and insulated from the gate of the second wordline transistor; a second local wordline disposed at the other side of the local bitline in the second region, extending in the second direction to intersect the local bitline, and electrically connected to an upper surface of the second wordline channel pillar; and a second memory cell formed at an intersection between the local bitline and the second local wordline. In this case, the gate of the first wordline transistor may be coupled to the gate of the second wordline transistor.

In yet other embodiments, the semiconductor memory device may further include: a first global wordline coupled to a lower surface of the first wordline channel pillar; a second global wordline coupled to a lower surface of the second wordline channel pillar; and a global bitline coupled to a lower surface of the bitline channel pillar.

In further embodiments, the first global wordline may be formed in a first wordline active portion defined in the semiconductor substrate below the gate of the first wordline transistor. The second global wordline may be formed in a second wordline active portion defined in the semiconductor substrate below the gate of the second wordline transistor. The global bitline may be formed in a bitline active portion defined in the semiconductor substrate below the gate of the bitline transistor.

In still further embodiments, the first memory cell may include a first variable resistor interposed between the first local wordline and the local bitline, and the second memory cell may include a second variable resistor interposed between the second local wordline and the local bitline.

In even further embodiments, the semiconductor memory device may further include: a gate of a block selection transistor disposed in the first region and spaced apart from the gates of the first and second wordline transistors; at least one block selection channel pillar penetrating the gate of the block selection transistor and insulated from the gate of the block selection transistor; and a block selection signal line electrically connected to a lower surface of the block selection channel pillar. In this case, an upper surface of the block selection channel pillar may be electrically connected to the gates of the first and second wordline transistors, which are coupled to each other.

BRIEF DESCRIPTION OF THE DRAWINGS

The accompanying drawings are included to provide a further understanding of the inventive concept and are incorporated in and constitute a part of this specification. The drawings illustrate exemplary embodiments of the inventive concept and, together with the description, serve to explain principles of the inventive concept. In the drawings:

FIGS. 6A, 7A, 8A, 9A, 10A, and 11A are cross-sectional views taken along line I-I' of FIG. 2 to describe a method of forming the semiconductor memory device according to one embodiment of the inventive concept, respectively;

DETAILED DESCRIPTION OF PREFERRED EMBODIMENTS

Figure 1:
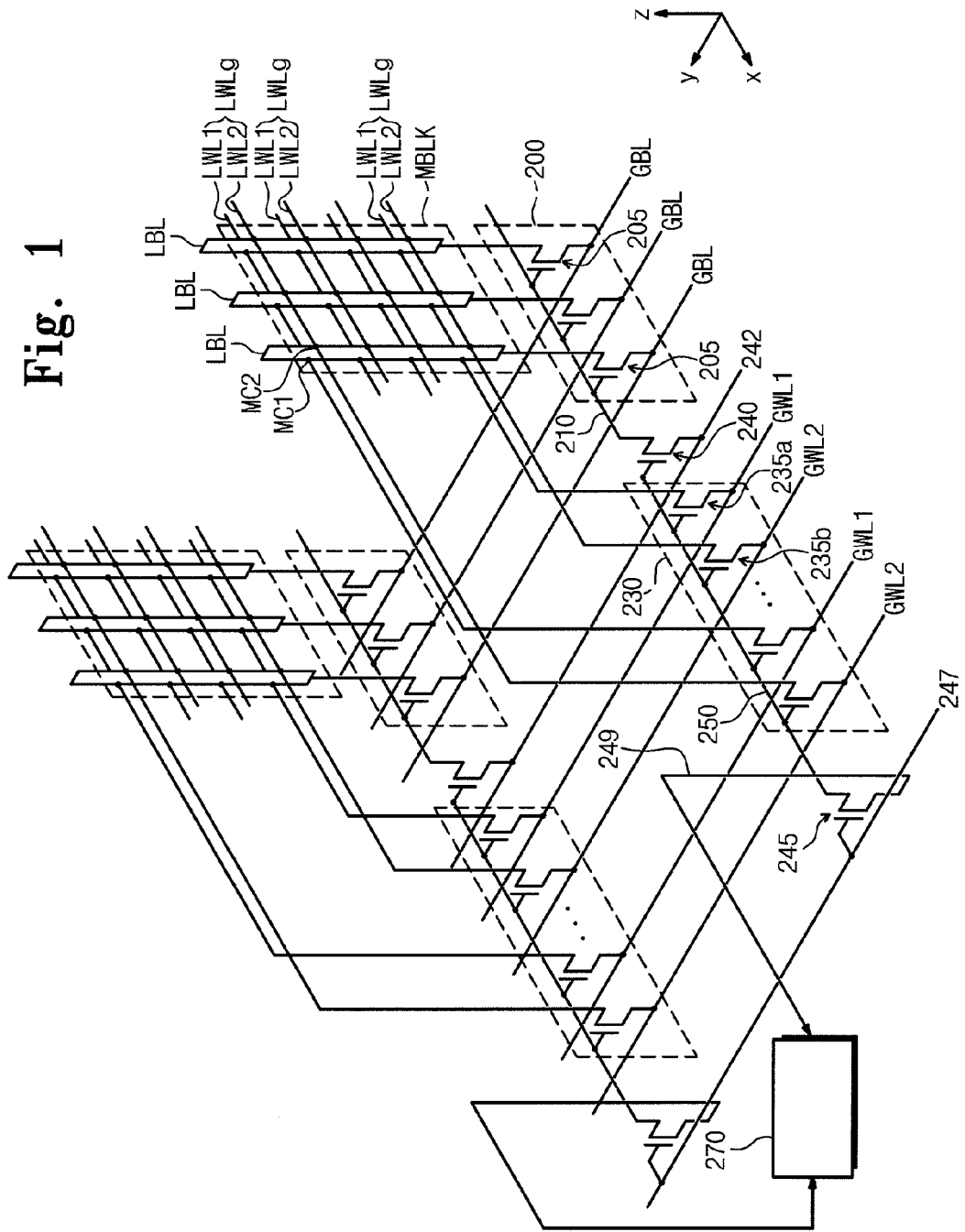
FIG. 1 is a circuit diagram illustrating a semiconductor memory device according to an embodiment of the inventive concept.

Exemplary embodiments of the inventive concept will be described below in more detail with reference to the accompanying drawings. The embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art. In drawings, the thickness of layers (or films) and regions is exaggerated to effectively describe technical details. It will be understood that when any layers (or films) are referred to as being "on" another material layer (or film) or substrate, it may be directly on the other material layer or substrate, or intervening elements or layers (or films) may be present. Throughout the specification, the same reference numerals can be denoted to the same components.

The terminology used herein is for the purpose of describing various embodiments only and is not intended to be limiting of exemplary embodiments. As used herein, the singular forms "a," "an," and "the" are intended to include the plural forms as well, unless the context clearly indicates otherwise. As used herein, the term "and/or" includes any and all combinations of one or more of the associated listed items.

FIG. 1 is a circuit diagram illustrating a semiconductor memory device according to an embodiment of the inventive concept.

With reference to FIG. 1, a semiconductor memory device according to one embodiment of the inventive concept may include a plurality of memory blocks MBLKs, a plurality of local bitline selection parts 200, a plurality of local wordline selection parts 230, and a block selection circuit 270. Each of the local bitline selection parts 200 corresponds to a memory block MBLK, and each of the wordline selection parts 230 also corresponds to a memory block MBLK. For instance, each local bitline selection part 200 and each local wordline selection part 230 may be coupled to a corresponding memory block MBLK. The semiconductor memory device further includes a plurality of bias transistors 240 and a plurality of block selection transistors 245. The local bitline selection part 200 and the local wordline selection part 230, which may be coupled to a corresponding memory block MBLK, may be coupled to each other by a corresponding bias transistor 240. Each of the block selection transistors 245 may be coupled to a corresponding wordline selection part 230.

Each of the memory blocks MBLKs includes a plurality of memory cells. The memory cells included in the semiconductor memory device may be three-dimensionally arranged through the memory blocks MBLKs. Specifically, each of the memory blocks MBLKs may include a plurality of local bitlines LBLs extending in parallel with each other along the z-axis direction and a plurality of first wordlines LWL1s extending in parallel with each other along the x-axis direction substantially perpendicular to the z-axis direction. The z-axis direction may be substantially vertical to an upper surface of a semiconductor substrate. The upper surface of the semiconductor substrate may be parallel to the xy-plane. The first wordlines LWL1s, which are provided in corresponding memory blocks MBLKs, may be stacked in the z-axis direction. The first wordlines LWL1s, which are provided in corresponding memory blocks MBLKs, may be spaced apart from each other in the z-axis direction. A first memory cell MC1 may be disposed at an intersection between the local bitline LBL and the first local wordline. The first memory cells MC1s may be disposed at corresponding intersections between the local bitlines LBLs and the first local wordlines LWL1s.

Each of the memory blocks MBLKs may further include a plurality of second local wordlines LWL2s extending parallel to each other along the x-axis direction. The second wordlines LWL2s also intersect with the local bitlines LBLs. A second memory cell MC2 may be disposed at an intersection between the second local wordline LWL2 and the local bitline LBL. A plurality of second memory cells MC2 may be coupled to intersections between the second local wordlines LWL2s and the local bitlines LBLs, respectively. The second wordlines LWL2s may be stacked in the z-axis direction. The second wordlines LWL2s may be spaced apart from each other in the z-axis direction.

The first local wordlines LWL1s may be disposed at a first side of the local bitlines LBLs, and the second local wordlines LWL2s may be disposed at a second side of the local bitlines LBLs. That is, the local bitlines LBLs may be disposed between the first local wordlines LWL1s and the second local wordlines LWL2s. The first and second memory cells MC1 and MC2 disposed at one of the local bitlines LBLs share one of the local bitlines LBLs. The heights of the second local wordlines LWL2s may be substantially the same to those of the first local wordlines LWL1s. In each of the memory blocks MBLKs, the first local wordline LWL1 and the second local wordline LWL2 having substantially the same height may be disposed at the first side and the second side of the local bitline LBL, respectively. The first and second local wordlines LWL1 and LWL2 are defined as a local wordline group LWLg. In each of the memory blocks MBLKs, the local wordline groups LWLgs may be stacked in a direction (that is, z-axis direction) where the local bitlines LBL extend. As described above, the first and second memory cells MC1 and MC2 may be disposed at the intersections between the local wordline groups LWLgs and the local bitlines LBLs and may share the local bitline LBL. Each of the first and second memory cells MC1 and MC2 may include a variable resistor (not illustrated in FIG. 1). The variable resistor can change into a plurality of stable states having different resistance values from each other. The first and second memory cells MC1 and MC2 may have nonvolatile characteristics.

The local bitlines LBLs of each memory block MBLK may be coupled to global bitlines GBLs, respectively. The plurality of memory blocks MBLKs may share the global bitlines GBLs. The global bitlines GBLs may extend in parallel with each other along the y-axis direction. The y-axis direction may be perpendicular to the z-axis direction and the x-axis direction. The global bitlines GBLs may be coupled to a sense amplifier (not illustrated). The memory blocks MBLKs may be disposed along the y-axis direction and may be spaced apart from each other in the y-axis direction. As a result, the memory cells MC1 and MC2 may be three-dimensionally disposed in the plurality of memory blocks MBLKs.

The local bitline selection part 200 may be disposed between the local bitlines LBLs of the memory block MBLK and the global wordlines GBLs. The local bitline selection part 200 includes a plurality of bitline transistors 205. Each of the bitline transistors 205 includes a first terminal and a second terminal. One of the first and second terminals corresponds to a source, and the other corresponds to a drain. Each of the first terminals may be coupled to a corresponding local bitline LBL provided in the memory block MBLK, and each of the second terminals may be coupled to a corresponding global bitline GBL.

The first wordlines LWL1s provided in the memory block MBLK may be coupled to a first global wordline GWL1, and the second wordlines LWL2s may be coupled to a second global wordline GWL2. The first and second global wordlines GWL1 and GWL2 may be coupled to a wordline decoder (not illustrated). The global wordlines GWL1 and GWL2 may be parallel to the global bitlines GBLs. The global wordlines GWL1 and GWL2 may extend in parallel with each other along the y-axis direction. The local wordline selection part 230 may be disposed between the local wordlines LWL1 and LWL2 provided in the memory block and the global wordlines GWL1 and GWL2. The local wordline selection part 230 may include first wordline transistors 235a and second wordline transistors 235b. The first wordline transistors 235a correspond to the first local wordlines LWL1, respectively. And the second wordline transistors 235b correspond to the second local wordlines LWL2. The first wordline transistor 235a includes a gate, a first terminal, and a second terminal. One of the first and second terminals corresponds to a source, and the other corresponds to a drain. The first terminal of the first wordline transistor 235a may be coupled to the first local wordline LWL1, and the second terminal may be coupled to the first global wordline GWL1. The second wordline transistor 235b includes a gate, a first terminal, and a second terminal. One of the first and second terminals corresponds to a source, and the other corresponds to a drain. The first terminal of the second wordline transistor 235b may be coupled to the second local wordline LWL2, and the second terminal may be coupled to the second global wordline GWL2.

The first wordline transistors 235a and the second wordline transistors 235b may alternately be disposed along the x-axis direction. The first wordline transistor 235a and the adjacent second wordline transistor 235b are defined as a wordline selection element group. The wordline selection element group may be coupled to the local wordline group LWLg. The number of wordline selection element groups in the local wordline selection part 230 may be the same as that of wordline groups LWLgs in the memory block MBLK.

The block selection circuit 270 generates a block selection signal to select one of the plural memory blocks MBLKs according to address information. The local bitline selection part 200 and the local wordline selection part 230 coupled to the memory block MBLK may be coupled to each other. As a result, it can select the local wordline selection part 230 and the local bitline selection part 200 coupled to the memory block MBLK selected by the block selection signal.

The local wordline selection part 230 may be coupled to the local bitline selection part 200 by the bias transistor 240. The bias transistor 240 includes a gate, a first terminal, and a second terminal. One of the first and second terminals corresponds to a source, and the other corresponds to a drain. One wordline selection gate line 250 may be coupled to gates of the first wordline transistors 235a and gates of the second wordline transistors 235b, which may be provided in the local wordline selection part 230. One bitline selection gate line 210 may be coupled to gates of the bitline transistors 205 provided in the local bitline selection part 200. The wordline selection gate line 250 extends to be coupled to a gate of the bias transistor 240. The first terminal of the bias transistor 240 may be coupled to the bitline selection gate line 210, and the second terminal may be coupled to a bias line 242. The second terminals of the plurality of bias transistors 240 corresponding to the plurality of memory blocks MBLKs may be coupled to one of the bias lines 242. The bias line 242 may extend in parallel with the global wordlines GWL1 and GWL2.

The plurality of block selection transistors 245 may be coupled to the plurality of local wordline selection parts 230, respectively. Specifically, the block selection transistor 245 includes a gate, a first terminal, and a second terminal. One of the first and second terminals corresponds to a source, and the other corresponds to a drain. The first terminal of the block selection transistor 245 may be coupled to the wordline selection gate line 250, and the second terminal may be coupled to a block selection signal line 249. At least a portion of the block selection signal line 249 may extend in the z-axis direction. That is, at least a portion of the block selection signal line 249 may be parallel to the local bitline LBL. The block selection signal line 249 may be coupled to the block selection circuit 270. The gate of the block selection transistor 245 may be coupled to a block selection gate line 247. The block selection gate line 247 may be parallel to the global wordlines GWL1 and GWL2.

A method of selecting one memory cell will be described for the above described semiconductor memory device as follows. A turn-on voltage may be applied to the block selection gate line 247, and the block selection circuit 270 provides a block selection signal to one selected from the block selection signal lines 249. The block selection signal may be supplied to the wordline selection gate line 250 through the selected block selection transistor 245. Accordingly, the wordline transistors 235a and 235b of the selected local wordline selection part 230 are turned on. Moreover, the bias transistor 240 coupled to the selected local wordline selection part 230 may be turned on. Since the selected bias transistor 240 may be turned on, a bias voltage supplied through the bias line 242 may be supplied to the bitline selection gate line 210 coupled to the first terminal of the selected bias transistor 240. As a result, the bitline transistors 205 of the selected local bitline selection part 200 are turned on.

One memory cell of one memory block MBLK may be selected by applying an operation voltage to a global wordline selected from the global wordlines GWL1 and GWL2 and a global bitline selected from the global bitlines GBLs.

According to the above-described semiconductor memory device, the memory cells MC1 and MC2 may be three-dimensionally arranged through the memory blocks MBLKs. As a result, the semiconductor memory device may be highly integrated. In addition, each of the memory blocks MBLKs may include the first memory cells MC1s and the second memory cells MC2s sharing the local bitlines LBLs. Therefore, the semiconductor memory device may be highly integrated.

Furthermore, the local bitline selection part 200 and the local wordline selection part 230 coupled to the memory block MBLK may be coupled to each other. As a result, one of the memory blocks MBLKs may be selected by one of the block selection signals. Consequently, the operating efficiency of the semiconductor memory device may be improved. In addition, the memory blocks MBLKs share the wordline decoder coupled to the global wordlines GWL1 and GWL2 and the sense amplifier coupled to the global bitlines GBLs. Therefore, the highly-integrated semiconductor memory device may be embodied.

According to some embodiments of the inventive concept, the memory block MBLK may include only the first memory cells MC1s. In this case, it can omit the second wordlines LWL2s, the second wordline transistors 235b, and the second global wordlines GWL2s.

Subsequently, an embodiment of the inventive concept in which the above-described semiconductor memory device may be embodied on a semiconductor substrate will be described as follows with reference to the accompanying drawings.

Figure 2:
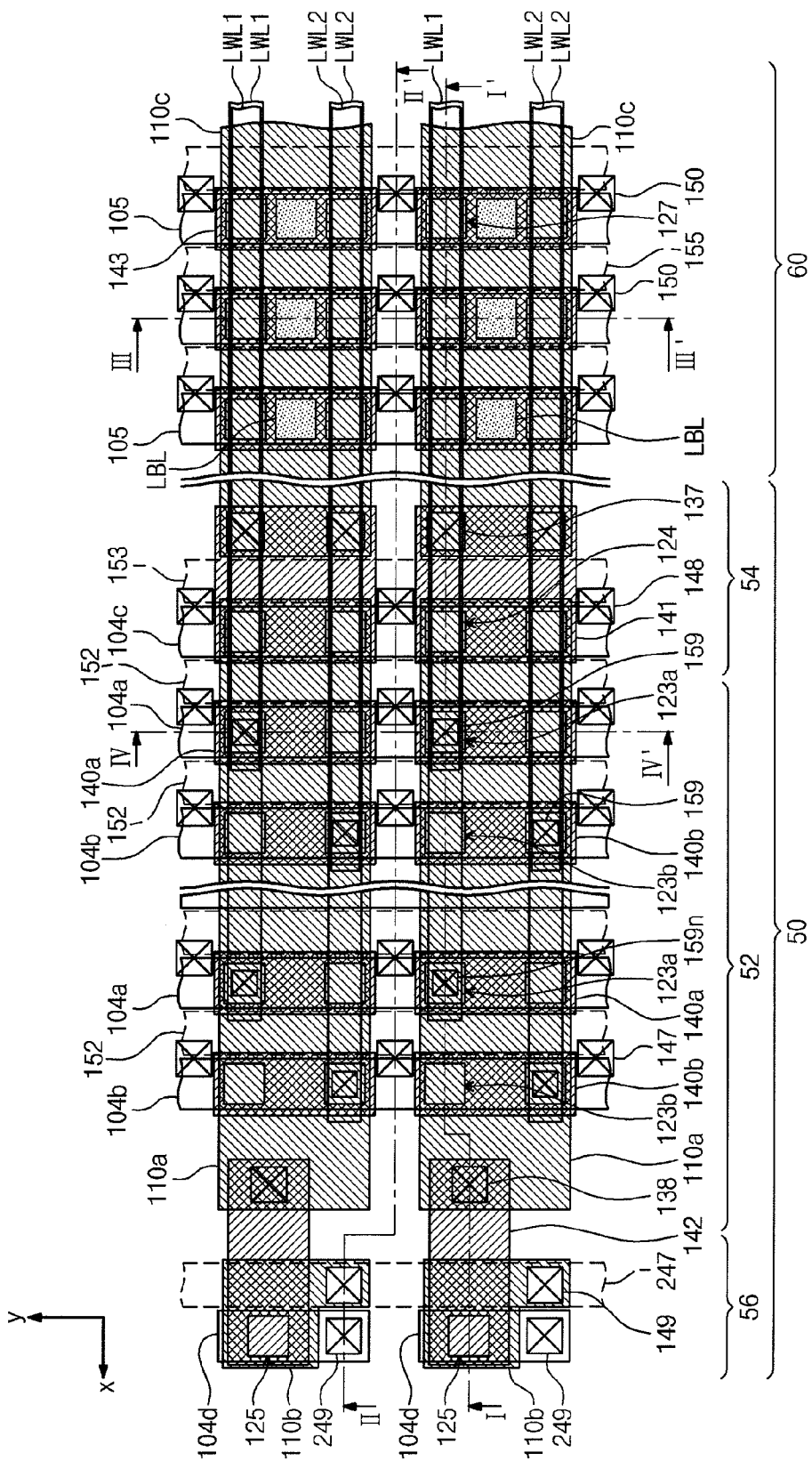
FIG. 2 is a plan view illustrating the semiconductor memory device according to one embodiment of the inventive concept.
Figure 3A:
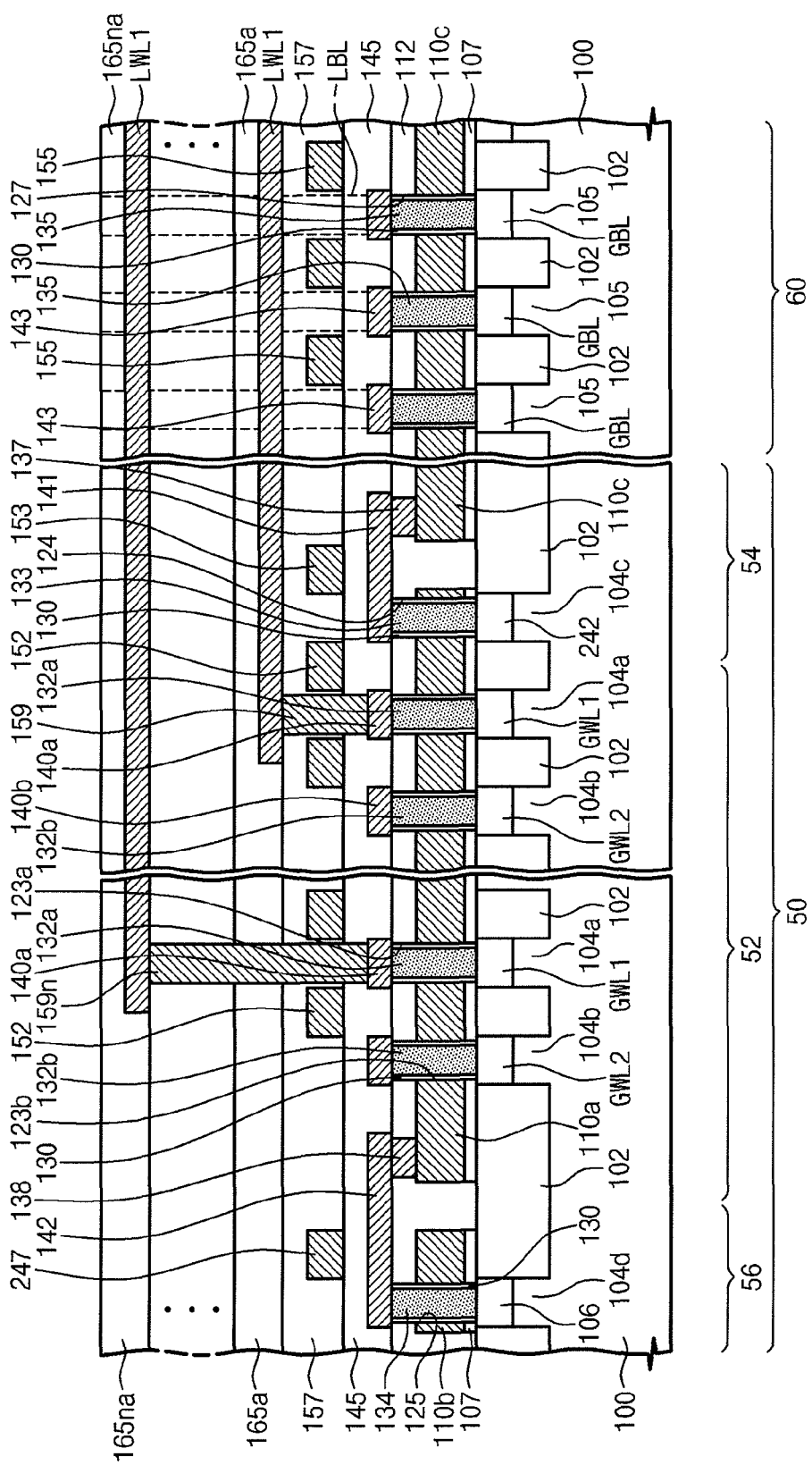
FIG. 3A is a cross-sectional view taken along line I-I' of FIG. 2.
Figure 3B:
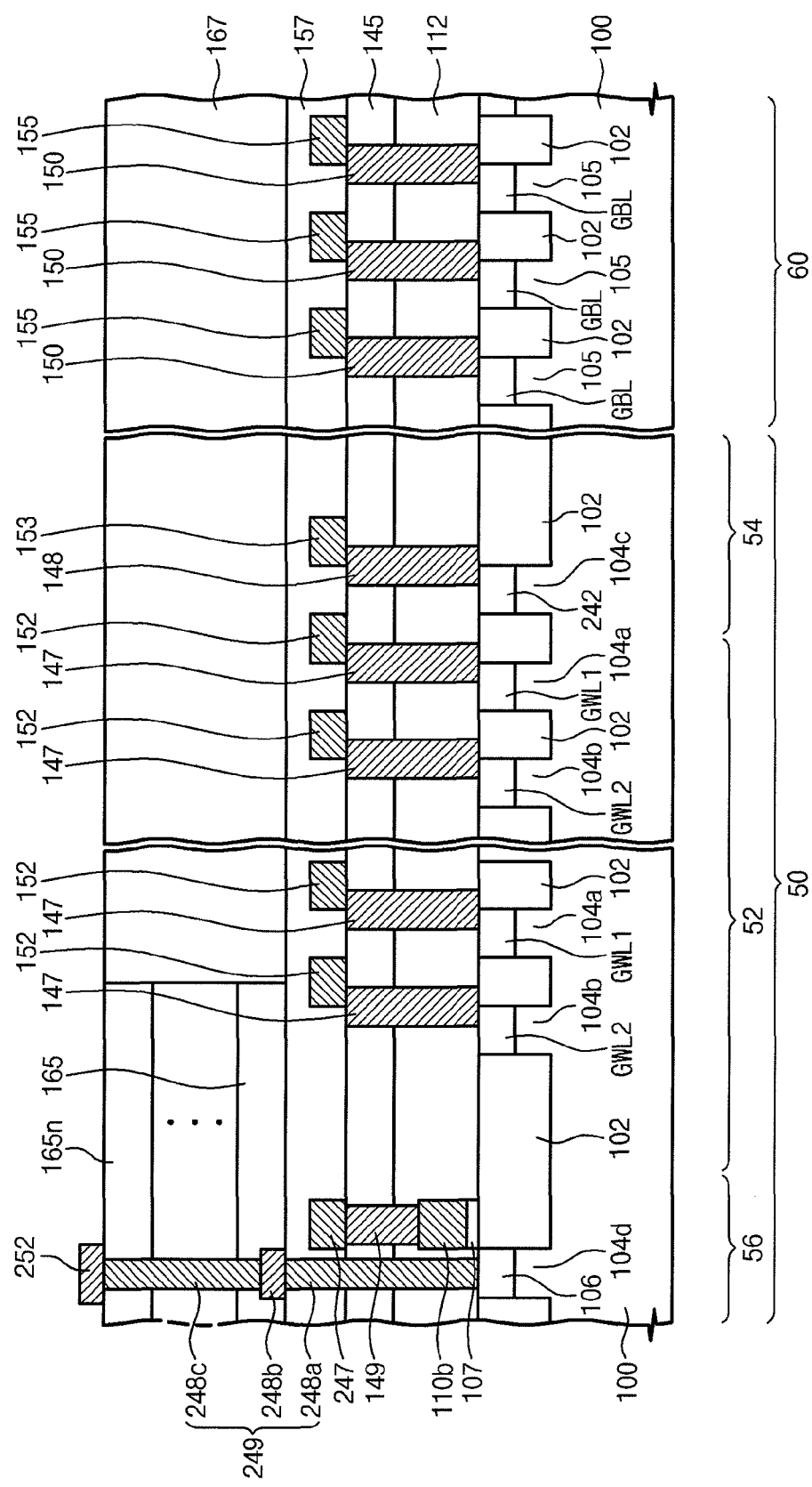
FIG. 3B is a cross-sectional view taken along line II-II' of FIG. 2.
Figure 3C:
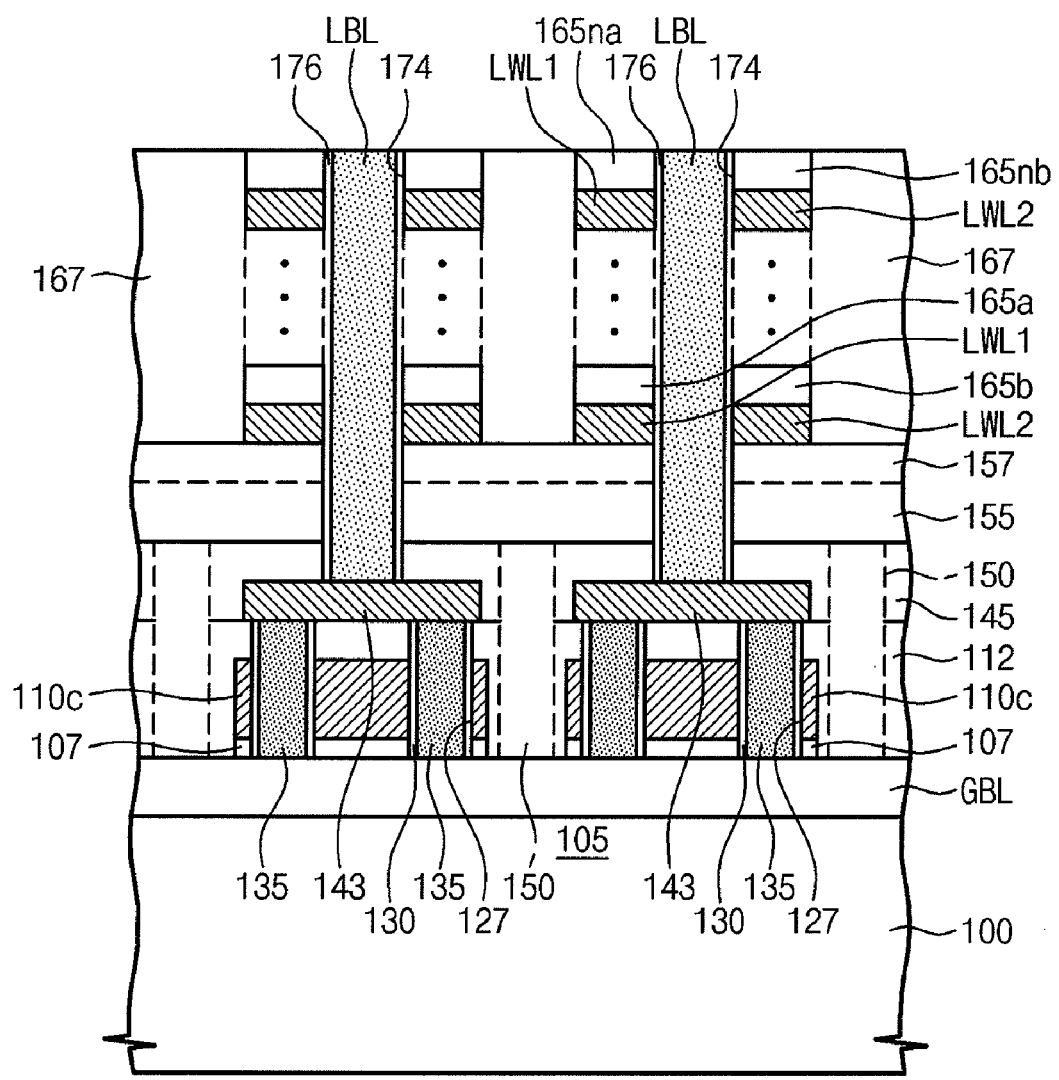
FIG. 3C is a cross-sectional view taken along line III-III' of FIG. 2.
Figure 3D:
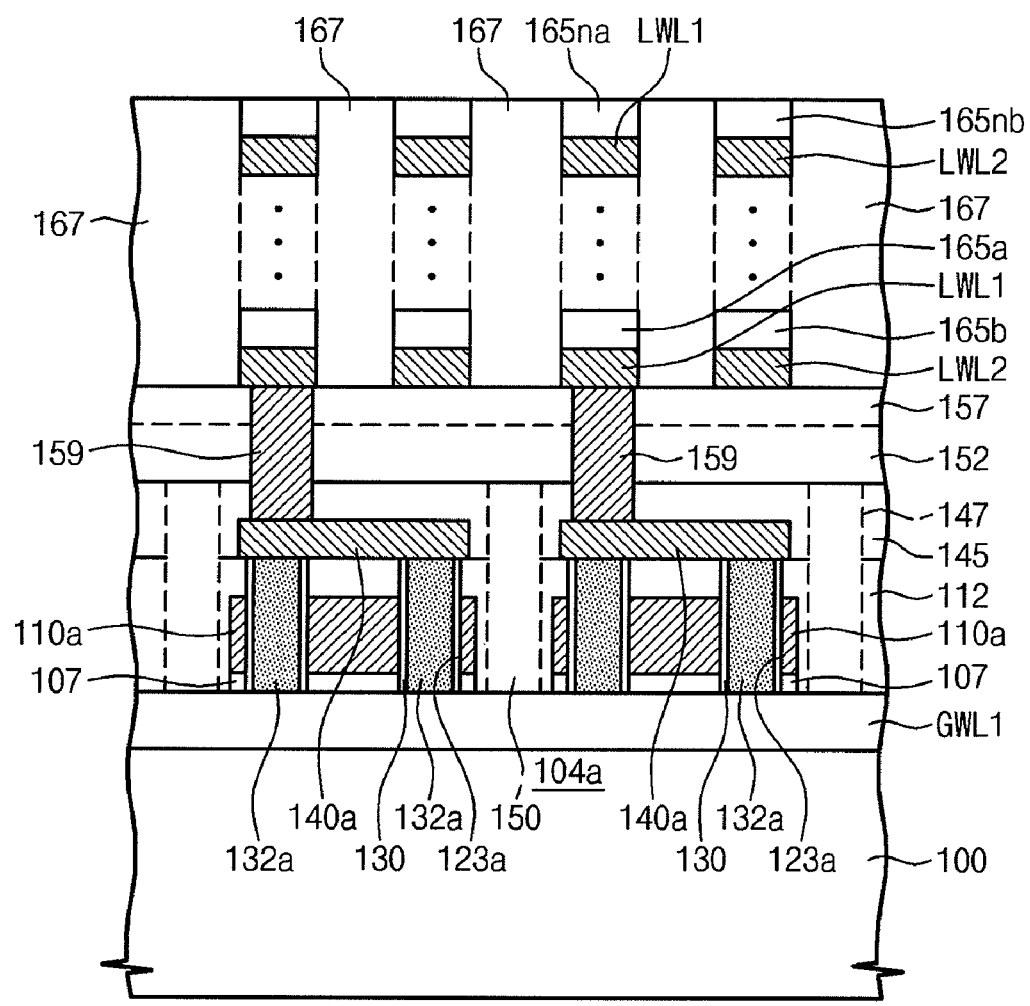
FIG. 3D is a cross-sectional view taken along line IV-IV' of FIG. 2.

FIG. 2 is a plan view illustrating the semiconductor memory device according to one embodiment of the inventive concept; and FIG. 3A is a cross-sectional view taken along line I-I' of FIG. 2; FIG. 3B is a cross-sectional view taken along line II-II' of FIG. 2; FIG. 3C is a cross-sectional view taken along line III-III' of FIG. 2; and FIG. 3D is a cross-sectional view taken along line IV-IV' of FIG. 2.

With reference to FIGS. 2, 3A, 3B, 3C, and 3D, a semiconductor substrate 100 includes a first region 50 and a second region 60. The first region 50 may be a peripheral region for driving the memory cells. The second region 60 may be a cell array region where the memory cells are disposed. The first region 50 may include a first sub-region 52 where a local wordline selection part similar to the local wordline selection part 230 shown in FIG. 1 is provided. Moreover, the first region 50 may further include a second sub-region 54 and a third sub-region 56. The second sub-region 54 may be arranged with a bias transistor similar to the bias transistor 240 illustrated in FIG. 1, and the third sub-region 56 may be arranged with a block selection transistor similar to the block selection transistor 245. In addition, although not illustrated in FIG. 2, the first region 50 may further include a block selection circuit similar to the block selection circuit 270 illustrated in FIG. 1, the sense amplifier (not illustrated), and other sub-regions in which the wordline decoder may be disposed. The memory blocks MBLKs and the local bitline selection parts 200 illustrated in FIG. 1 may be disposed in the second region 60.

A device isolation pattern 102 may be disposed on the semiconductor substrate 100 to define active portions 104a, 104b, 104c, 104d, and 105. The device isolation pattern 102 may be a trench type isolation pattern. First wordline active portions 104a, second wordline active portions 104b, bias active portion 104c, and the block active portion 104d are defined in the first region 50. The first and second wordline active portions 104a and 104b may be disposed in the first sub-region 52, the bias active portion 104c may be disposed in the second sub-region 54, and the block selection active portion 104d may be disposed in the third sub-region 56. The first sub-region 52 may be disposed between the second sub-region 54 and the third sub-region 56. In one embodiment, the second sub-region 54 may be disposed between the first sub-region 52 and the second region 60. Bitline active portions 105 are defined in the second region 60. The active portions 104a, 104b, 104c, 104d, and 105 may be portions of the semiconductor substrate 100 surrounded by the device isolation pattern 102. The active portions 104a, 104b, 104c, 104d, and 105 may be doped with a first-type dopant such as . . . .

The first wordline active portions 104a and the second wordline active portions 104b may be positioned approximately parallel with each other along the y-axis direction. The first wordline active portions 104a and the second wordline active portions 104b may be alternately disposed along the x-axis direction substantially perpendicular to the y-axis direction. The bias active portion 104c may extend in parallel with the first and second wordline active portions 104a and 104b. A plurality of block selection active portions 104d may be provided in the third sub-region 56. The block selection active portions 104d may be arranged in a column along the y-axis direction. Preferably, the block selection active portions 104d may be spaced apart from each other in the y-axis direction. The device isolation pattern 102 may be disposed between the adjacent block selection active portions 104d. The bitline active portions 105 may also be arranged parallel to each other along the y-axis direction. That is, the bitline active portion 105 may extend parallel to the first and second wordline active portions 104a and 104b.

The distance between the first wordline active portion 104a and adjacent second wordline active portion 104b may be "1 F" in the x-axis direction. The symbol "F" may be defined as a minimum unit in a design rule. The distance between the bias active portion 104c and the first wordline active portion 104a closest thereto may also be "1 F" in the x-axis direction. The distance between the block selection active portion 104d and the second wordline active portion 104b closest thereto may be larger than "1 F" in the x-axis direction. For instance, the distance between the block selection active portion 104d and the second wordline active portion 104b closest thereto may be "4 F" in the x-axis direction.

The first global wordline GWL1 may be formed in the first wordline active portion 104a, respectively, and the second global wordline GWL2 may be formed in the second wordline active portion 104b, respectively. The first global wordline GWL1 extends in a longitudinal direction of the first wordline active portion 104a, and the second global wordline GWL2 extends in a longitudinal direction of the second wordline active portion 104b. The first and second global wordlines GWL1 and GWL2 may be regions doped with a dopant. The first and second global wordlines GWL1 and GWL2 may be doped with a dopant different from the dopant used in the wordline active portions 104a and 104b. That is, the first and second global wordlines GWL1 and GWL2 may be doped with a second-type dopant such as . . . . One of the first and second dopants may be an n-type dopant, and the other may be a p-type dopant. Like the wordline active portions 104a and 104b, the first global wordlines GWL1 and the second global wordlines GWL2 may be alternately disposed along the x-axis direction.

The bias line 242 may be formed in the bias active portion 104c. The bias line 242 may be a region doped with the second-type dopant. The bias line 242 extends in a longitudinal direction of the bias active portion 104c. The bias line 242 may be parallel to the global wordlines GWL1 and GWL2. Multiple block selection doped regions 106 may be formed in the block selection active portions 104d, respectively. The block selection doped regions 106 may be doped with the second-type dopant. The block selection doped regions 106 may be spaced apart from each other and may be electrically insulated from each other.

Subsequently, referring to FIGS. 2, 3A, 3B, 3C, and 3D, a first gate pattern 110a and a block selection gate pattern 110b may be disposed on the semiconductor substrate 100 of the first region 50, and a second gate pattern 110c may be disposed on the semiconductor substrate 100 of the second region 60. The second gate pattern 110c, the first gate pattern 110a, and the block selection gate pattern 110b may be formed in a single row along the x-axis direction. The second gate pattern 110c, the first gate pattern 110a, and the block selection gate pattern 110b may be spaced apart from each other in the x-axis direction. The second gate pattern 110c, the first gate pattern 110a, and the block selection gate pattern 110b formed in a single row may be defined as a gate group. A plurality of gate groups may be provided on the semiconductor substrate 100. The gate groups may be disposed in parallel with each other on the semiconductor substrate 100. The gate groups may be spaced apart from each other in the y-axis direction. An insulating pattern 107 may be disposed between the gate patterns 110a, 110b, and 110c and the semiconductor substrate 100.

The first gate pattern 110a extends in the x-axis direction to intersect the first wordline active portions 104a and the second wordline active portions 104b. In addition, the first gate pattern 110a also intersects the bias active portion 104c. The block selection gate pattern 110b may extend toward the device isolation pattern 102 disposed at one side of the block selection active portion 104d. An extension part of the block selection gate pattern 110b may be disposed between the block selection active portion 104d and the first gate pattern 110a. The second gate pattern 110c extends in the x-axis direction to intersect the bitline active portions 105. The second gate pattern 110c may further extend in a portion of the second sub-region 54. The extending part of the second gate pattern 110c in the second sub-region 54 may be disposed on the device isolation pattern 102 arranged at the side of the bias active portion 104c. In this case, the second gate pattern 110c may be spaced apart from the first gate pattern 110a.

A first portion of the first gate pattern 110a disposed on each of the first wordline active portions 104a corresponds to the gate of the first wordline transistor 235a illustrated in FIG. 1. A second portion of the first gate pattern 110a disposed on each of the second wordline active portions 104b corresponds to the gate of the second wordline transistor 235b illustrated in FIG. 1. Moreover, a third portion of the first gate pattern 110a disposed on the bias active portion 104c corresponds to the gate of the bias transistor 240 illustrated in FIG. 1. That is, the first gate pattern 110a includes gates of the first wordline transistors, gates of the second wordline transistors, and gates of the bias transistors. The entire first gate pattern 110a corresponds to the wordline selection gate line 250 illustrated in FIG. 1. The block selection gate pattern 110b corresponds to the gate of the block selection transistor 245 illustrated in FIG. 1. A portion of the second gate pattern 110c disposed on the bitline active portions 105 corresponds to the gate of the bitline transistor 205 illustrated in FIG. 1. Substantially the entire second gate pattern 110c may correspond to the bitline selection gate line 210 illustrated in FIG. 1.

A first interlayer insulating layer 112 may be substantially disposed on substantially the entire surface of the semiconductor substrate 100. The first interlayer insulating layer 112 covers the gate patterns 110a, 110b, and 110c. Furthermore, the first interlayer insulating layer 112 may fill spaces between the gate patterns 110a, 110b, and 110c. The first interlayer insulating layer 112 may have a planarized upper surface. The first interlayer insulating layer 112 may contain oxides, nitrides, and/or oxynitrides.

Referring subsequently to FIGS. 2, 3A, 3B, 3C, and 3D, a first wordline channel pillar 132a may be coupled to the first global wordline GWL1 by sequentially penetrating the first interlayer insulating layer 112, the first portion of the first gate pattern 110a, and the insulating pattern 107. The first wordline channel pillar 132a may be disposed in a first wordline channel hole 123a. One or more first wordline channel pillars 132a may penetrate the first portion of the first gate pattern 110a. In other words, one or more first wordline channel pillars 132a may penetrate one of the gates of the first wordline transistors (235a in FIG. 1). Details of shapes of the first wordline channel pillar 132a will be described below. Due to the first wordline channel pillar 132a, the first wordline transistor (235a in FIG. 1) has a vertical-type channel. The vertical-type channel may be substantially vertical to the upper surface of the semiconductor substrate 100. The thickness of the first gate pattern 110a may correspond to the channel length of the vertical-type channel, and the circumference of the first wordline channel pillar 132a may correspond to the channel width of the vertical-type channel.

One or more second wordline channel pillars 132b may be coupled to the second global wordline GWL2 by sequentially penetrating the first interlayer insulating layer 112, the second portion of the first gate pattern 110a (that is, the gate of the second wordline transistor), and the insulating pattern 107. The second wordline channel pillar 132b may be disposed in a second wordline channel hole 123b. One or more bias channel pillars 133 may be coupled to the bias line 242 by sequentially penetrating the first interlayer insulating layer 112, the third portion of the first gate pattern 110a (that is, the gate of the bias transistor), and the insulating pattern 107. The bias channel pillar 133 may be disposed in a bias channel hole 124. A block selection channel pillar 134 may be coupled to the block selection doped region 106 by sequentially penetrating the first interlayer insulating layer 112, the block selection gate pattern 110b, and the insulating pattern 107. The block selection channel pillar 134 may be disposed in a block selection channel hole 125. One or more bitline channel pillars 135 may be coupled to the global bitline GBL by sequentially penetrating the first interlayer insulating layer 112, the second gate pattern 110c, and the insulating pattern 107, of the second region 60. The bitline channel pillar 135 may be disposed in a bitline channel hole 127. Gate insulating patterns 130 may be interposed between the channel pillars 132a, 132b, 133, 134, and 135 and inner sidewalls of the channel holes 123a, 123b, 124, 125, and 127, respectively.

Upper surfaces of the channel pillars 132a, 132b, 133, 134, and 135 may be substantially coplanar with the upper surface of the first interlayer insulating layer 112. The channel pillars 132a, 132b, 133, 134, and/or 135 may be formed of semiconductor material. The channel pillars 132a, 132b, 133, 134, and/or 135 may be doped with a dopant different from a dopant in the first global wordline GWL1, the second global wordline GWL2, the bias line 242, the block selection doped region 106, and/or the global bitline GBL. For instance, the channel pillars 132a, 132b, 133, 134, and/or 135 may be doped with the first-type dopant. According to one embodiment of the inventive concept, the channel pillars 132a, 132b, 133, 134, and/or 135 may be substantially undoped. Due to the channel pillars 132a, 132b, 133, 134, and 135, the transistors 235a, 235b, 240, 245, and 205 illustrated in FIG. 1 may have vertical-type channels.

A first wordline pad pattern 140a may be disposed on the first interlayer insulating layer 112 to come in contact with the upper surface of the first wordline channel pillar 132a. As illustrated in drawings, when a plurality of first wordline channel pillars 132a penetrate one of the gates of the first wordline transistors (that is, the first portion of the first gate pattern 110a), the first wordline pad pattern 140a may come in contact with the upper surfaces of the plurality of first wordline channel pillars 132a penetrating one of the gates of the first wordline transistors. A second wordline pad pattern 140b may be disposed on the first interlayer insulating layer 112 to come in contact with the upper surface of the second wordline channel pillar 132b. The second wordline pad pattern 140b may also come in contact with the upper surfaces of a plurality of second wordline channel pillars 132b penetrating one of the gates of the second wordline transistors (that is, the second portion of the first gate pattern 110a). A plurality of first wordline pad patterns 140a may be provided over the first gate pattern 110a and the first wordline pad patterns 140a correspond to the first wordline active portions 104a, respectively. Also, a plurality of second wordline pad patterns 140b may be provided over the first gate pattern 110a and the second wordline pad patterns 140b correspond to the second wordline active portions 104b, respectively. The first wordline pad patterns 140a and the second wordline pad patterns 140b may be spaced apart from each other.

A bias pad pattern 141 may be disposed on the first interlayer insulating layer 112 to come in contact with the upper surface of the bias channel pillar 133. Like the first and second wordline pad patterns 140a and 140b, the bias pad pattern 141 may come in contact with the upper surfaces of a plurality of bias channel pillars 133 penetrating the gate of the bias transistor (that is, the third portion of the first gate pattern 110a). Preferably, the upper surface of the bias channel pillar 133 may be electrically connected to the second gate pattern 110c through the bias pad pattern 141. A first gate contact plug 137 may come in contact with the upper surface of the second gate pattern 110c, which extends in the second sub-region 54, by penetrating the first interlayer insulating layer 112. The bias pad pattern 141 may extend laterally to come in contact with the upper surface of the first gate contact plug 137.

A block selection pad pattern 142 may be disposed on the first interlayer insulating layer 112 to come in contact with the upper surface of the block selection channel pillar 134. The block selection pad pattern 142 may come in contact with the upper surfaces of a plurality of block selection channel pillars 134 penetrating the block selection gate pattern 110b. The upper surface of the block selection channel pillar 134 may be electrically connected to the first gate pattern 110a. A second gate contact plug 138 may come in contact with the upper surface of the first gate pattern 110a by penetrating the first interlayer insulating layer 112. The block selection pad pattern 142 extends laterally to come in contact with the upper surface of the second gate contact plug 138.

A bitline pad pattern 143 may be disposed on the first interlayer insulating layer 112 arranged in the second region 60 to come in contact with the upper surface of the bitline channel pillar 135. The bitline pad pattern 143 may come in contact with the upper surfaces of a plurality of bitline channel pillars 135 penetrating one of the gates of the bitline transistors.

The pad patterns 140a, 140b, 141, 142, and 143 may be laterally spaced apart from each other. The pad patterns 140a, 140b, 141, 142, and 143 may contain at least one semiconductor substance (for example, silicon, germanium, or silicon-germanium) doped with the second-type dopant, conductive metal nitrides (for example, titanium nitride or tantalum nitride), metal silicides (for example, tungsten silicide or cobalt silicide), and metals (for example, titanium, tantalum, tungsten, or aluminum). The first wordline pad pattern 140a, the second wordline pad pattern 140b, the bias pad pattern 141, the block selection pad pattern 142, and the bitline pad pattern 143 may correspond to the first terminal of the first wordline transistor 235a, the second wordline transistor 235b, the bias transistor 240, the block selection transistor 245, and the bitline transistor 205, which are illustrated in FIG. 1, respectively. A portion of the first global wordline GWL1, a portion of the second wordline GWL2, a portion of the bias line 242, the block selection doped region 106, and a portion of the global bitline GBL each coupled to the bottom surfaces of the channel pillars 132a, 132b, 133, 134, and 135 may correspond to the second terminal of the first wordline transistor 235a, the second wordline transistor 235b, the bias transistor 240, the block selection transistor 245, and the bitline transistor 205, illustrated in FIG. 1, respectively.

A second interlayer insulating layer 145 may be disposed on the pad patterns 140a, 140b, 141, 142, and 143 and the first interlayer insulating layer 112. The second interlayer insulating layer 145 may be formed of a dielectric material such as oxides, nitrides, and/or oxynitrides.

A block selection gate line 247 may be disposed on the second interlayer insulating layer 145 of the third sub-region 56 included in the first region 50. The block selection gate line 247 may extend in the y-axis direction. The block selection gate line 247 may be electrically connected to the block selection gate pattern 110b. As illustrated in FIG. 3B the block selection gate line 247 may electrically be connected to the block selection gate pattern 110b through a third gate contact plug 149 penetrating sequentially the second and first interlayer insulating layers 145 and 112. The block selection gate line 247 may be electrically connected to the plurality of block selection gate patterns 110b disposed in a column along the y-axis direction. The third gate contact plug 149 may be insulated from the block selection pad pattern 142. In this respect, the block selection gate pattern 110b may include portions not being overlapped with the block selection pad pattern 142, preferably.

As illustrated in FIGS. 2, 3A and 3B, wordline strapping lines 152 may be formed on the second interlayer insulating layer 145 of the first sub-region 52. The wordline strapping lines 152 may extend in parallel with each other along the y-axis direction. That is, the wordline strapping lines 152 may be parallel to the block selection gate line 247 (FIG. 3B). The wordline strapping lines 152 may be electrically connected to the first global wordlines GWL1 and the second global wordlines GWL2, respectively (FIG. 3B). The number of wordline strapping lines 152 may be equal to the sum of the number of first global wordlines GWL1 and the number of second global wordline GWL2. Preferably, each of the wordline strapping lines 152 may be disposed on the device isolation pattern 102 of the first sub-region 52. The wordline strapping line 152 may come in contact with a wordline strapping contact plug 147 coupled to the global wordline GWL1 or GWL2 disposed at one side of the first gate pattern 110*a* by sequentially penetrating the second and first interlayer insulating layers 145 and 142. The wordline strapping contact plug 147 may simultaneously come in contact with a portion of the global wordline GWL1 or GWL 2 and a portion of the device isolation pattern 102 disposed at one side of the global wordline GWL1 or GWL. The wordline strapping line 152 may come in contact with a portion of the upper surface of the wordline strapping contact plug 147 located at the upper part of the device isolation pattern 102. The wordline strapping line 152 may contain conductive substances having low resistivity compared to the global wordlines GWL1 and GWL2. For instance, the wordline strapping line 152 may contain at least one selected from conductive metal nitrides (for example, titanium nitride, or tantalum nitride), metal silicides (for example, tungsten silicide or cobalt silicide), and metals (for example, titanium, tantalum, tungsten, aluminum, or copper).

Similarly, as shown in FIG. 3B, a bias strapping line 153 may be disposed on the second interlayer insulating layer 145 of the second sub-region 54 and be electrically connected to the bias line 242. The bias strapping line 153 may be disposed at the upper part of the device isolation pattern 102 of the second sub-region 54. The bias strapping line 153 may come in contact with a bias strapping contact plug 148 coupled to the bias line 242 disposed at one side of the first gate pattern 110*a* by sequentially penetrating the second and first interlayer insulating layers 145 and 142. The bias strapping contact plug 148 may simultaneously come in contact with a portion of the bias line 242 and a portion of the device isolation pattern 102 disposed at one side of the bias line 242. The bias strapping line 153 may come in contact with a portion of the upper surface of the bias strapping contact plug 148 located in the upper part of the device isolation pattern 102. The bias strapping line 153 may contain conductive substances having low resistivity compared to the bias line 242. For instance, the bias strapping line 153 may be formed of the same substances as the wordline strapping line 152.

Bitline strapping lines 155 may be disposed on the second interlayer insulating layer 145 of the second region 60 and be electrically connected to the global bitlines GBL as shown in FIG. 3B, respectively. Each of the bitline strapping lines 155 may be disposed at the upper part of the device isolation pattern 102 of the second region 60. Each of the bitline strapping line 155 may come in contact with a bitline strapping contact plug 150 coupled to the global bitline GBL disposed at one side of the second gate pattern 110*c* by sequentially penetrating the second and first interlayer insulating layers 145 and 142. The bitline strapping contact plug 150 may simultaneously come in contact with a portion of the global wordline GBL and a portion of the device isolation pattern 102 disposed at one side of the global wordline GBL. The bitline strapping line 155 may come in contact with a portion of the upper surface of the bitline strapping contact plug 150 located at the upper part of the device isolation pattern 102 of the second region 60. The bitline strapping line 155 may contain conductive substances having low resistivity compared to the global wordline GBL. For instance, the bitline strapping line 155 may be formed of the same substances as the wordline strapping line 152. The block selection gate line 247 and the strapping lines 152, 153, and 155 may be disposed higher than the pad patterns 140*a*, 140*b*, 141, 142, and 143 as illustrated in FIG. 3A.

In contrast, according to one embodiment of the inventive concept, the pad patterns 140*a*, 140*b*, 141, 142, and 143 may be disposed higher than the block selection gate line 247 and the strapping lines 152, 153, and 155. In this case, the block selection gate line 247 and the strapping lines 152, 153, and 155 may be disposed between the second interlayer insulating layer 145 and the first interlayer insulating layer 112, and the pad patterns, 140*a*, 140*b*, 141, 142, and 143 may be disposed on the second interlayer insulating layer 145. In addition, the channel pillars 132*a*, 132*b*, 133, 134, and 135 extend upward and may further penetrate the second interlayer insulating layer 145. Portions of the channel pillars 132*a*, 132*b*, 133, 134, and 135, which penetrate the second interlayer insulating layer 145, may be doped with the second-type dopant that may be the same dopant as may be used to dope the global wordlines GWL1 and GWL2, the bias line 242, and the global bitline GBL.

With reference to FIGS. 2, 3A, 3B, 3C, and 3D, subsequently, a third interlayer insulating layer 157 may be disposed on the strapping lines 152, 153, and 155, the block selection gate line 247, and the second interlayer insulating layer 145. The third interlayer insulating layer 157 may contain a dielectric material such as oxides, nitrides, and/or oxynitrides.

The local bitline LBL may be disposed at the upper surface of the semiconductor substrate 100 in the second region 60 while extending in a vertical direction. The local bitline LBL may be electrically connected to the upper surface of the bitline channel pillar 135. The local bitline LBL extends upward over the upper surface of the third interlayer insulating layer 157. The local bitline LBL penetrates the third interlayer insulating layer 157 and may come in contact with the upper surface of the bitline pad pattern 143. For instance, the bottom of the local bitline LBL penetrates the third interlayer insulating layer 157 and may come in contact with the upper surface of the bitline pad pattern 143, while the top of the local bitline LBL may be protruded higher than the upper surface of the third interlayer insulating layer 157. The bitline pad patterns 143 may be arranged along rows and columns in the second region 60. The plurality of local bitlines LBL may be each coupled to the bitline pad patterns 143 and arranged in rows and columns. The rows may be parallel to the x-axis direction, and the columns may be parallel to the y-axis direction. The local bitlines LBL, which form each of the rows, may be disposed at the upper part of the second gate pattern 110*c*. The local bitline LBL may be formed of conductive substances.

The plurality of first local wordlines LWL1 may be sequentially stacked on the third interlayer insulating layer 157 disposed at one side of the local bitlines LBL included in each of the rows. The first stacked local wordlines LWL1 intersect with the local bitlines LBL. The first stacked local wordlines LWL1 may be disposed at the upper part of the second gate pattern 110*c* located at one side of the local bitline LBL. The lowermost and uppermost first local wordlines LWL1 are illustrated in FIGS. 2 and 3A, but at least a first local wordline LWL1 may further be interposed between the lowermost and uppermost first local wordlines LWL1. The stacked first local wordlines LWL1 may be spaced apart from each other up and down by a first inter-line insulating pattern 165*a*. A first capping insulating pattern 165*na* may be disposed on the uppermost first local wordline LWL1.

The plurality of second local wordlines LWL2 may be sequentially stacked on the third interlayer insulating layer 157 disposed at the other side of the local bitlines LBL included in each of the rows. The stacked second local wordlines LWL2 intersect with the local bitlines LBL. Preferably, the stacked second local wordlines LWL2 may be disposed at the upper part of the second gate pattern 110*c* located at the other side of the local bitline LBL. Therefore, the local bitline LBL and the first and second local wordlines LWL1 and LWL2 located at both sides of the local bitline LBL may be disposed at the upper part of the second gate pattern 110c. The stacked second local wordlines LWL2 may also be spaced apart from each other up and down by a second inter-line insulating pattern 165b. The second inter-line insulating pattern 165b may be formed of the same substance as the first inter-line insulating pattern 165a. A second capping insulating pattern 165nb may be disposed on the uppermost second local wordline LWL2. The second capping insulating pattern 165nb may be formed of the same substance as the first capping insulating pattern 165na. The number of stacked second local wordlines LWL2 may be equal to that of stacked first local wordlines LWL1. The stacked second local wordlines LWL2 may be located at substantially the same level as the stacked first local wordlines LWL1. As illustrated in FIG. 1, the stacked first and second local wordlines LWL1 and LWL2, which may be located at the same position and intersect with both sidewalls of the local bitline LBL, are defined as a local wordline group LWLg. A plurality of stacked local wordline groups may intersect with the local bitlines LBL of each row.

Memory cells may be formed at intersections between the first local wordlines LWL1 and the local bitlines LBL and at intersections between the second local wordlines LWL2 and the local bitlines LBL, respectively. Each of the memory cells includes a variable resistor 176. The variable resistor 176 may be changeable into a plurality of states having different resistance values from each other. The variable resistor 176 may be formed of material in which the resistance values can be varied by the generation and extinguishment of a filament and/or a bridge. For instance, the variable resistor 176 may contain transition metal oxides.

In contrast, the variable resistor 176 may contain a phase-change material in which the resistivity can be changed by the supply temperature and/or the supply time of heat. For example, the variable resistor 176 may be formed of a compound including at least one of tellurium (Te) and selenium (Se), which are chalcogenide elements, and at least one selected from Ge, Sb, Bi, Pb, Sn, Ag, As, S, Si, P, O, and N.

Unlike this, the variable resistor 176 may contain a magnetic tunnel junction (MTJ) structure in which the resistance value can be varied according to the magnetization direction between free layers and pinned layers.

The memory cell, which may be formed at the intersection between the first local wordline LWL1 and the local bitline LBL, corresponds to the first memory cell MC1 illustrated in FIG. 1. In addition, the memory cell, which may be formed at the intersection between the second local wordline LWL2 and the local bitline LBL, corresponds to the second memory cell MC2 illustrated in FIG. 1. The variable resistor 176 between the first local wordline LWL1 and the local bitline LBL may be included in the first memory cell, and the variable resistor 176 between the second local wordline LWL2 and the local bitline LBL may be included in the second memory cell.

As described above, the second gate pattern 110c, the first gate pattern 110a, and the block selection gate pattern 110b may be formed in the one row along the x-axis direction. As a result, the first wordline pad patterns 140a and the second wordline pad patterns 140b each disposed at the upper part of the first gate patterns 110a and the bitline pad patterns 143 each disposed at the upper part of the second gate patterns 110c may be formed in the one row along the x-axis direction. The first local wordlines LWL1 and the second local wordlines LWL2 extend in the first region 50, expecially, the second sub-region 52 along the x-axis direction. As shown in FIGS. 2 and 3A, the first local wordlines LWL1 may be electrically connected to the first wordline pad patterns 140a in a single row, respectively. Similarly, the second wordlines LWL2 may be electrically connected to the second wordline pad patterns 140b in a single row, respectively.

The lowermost first local wordline of the stacked first local wordlines LWL1 may be electrically connected to the upper surface of the first wordline channel pillar 132a coupled to the first global wordline GWL1 closest to the second gate pattern 110c in the one row. Furthermore, the uppermost first local wordline of the stacked first local wordlines LWL1 may be electrically connected to the upper surface of the first wordline channel pillar 132a coupled to the first global wordline GWL1 farthest from the second gate pattern 110c in the one row. Accordingly, in the stacked first local wordlines LWL1, one of the first local wordlines LWL1, which is located relatively high compared to the other first local wordlines LWL1, may extend a greater length in the x-axis direction compared to the other lower first local wordlines LWL1. The lower surface of the first local wordlines LWL1 may come in contact with the upper surface of the contact plug 159 or 159n, which may be coupled to the first wordline pad pattern 140a by penetrating at least one of the insulating pattern 165a and the interlayer insulating layers 157 and/or 145.

Similarly, as shown in FIGS. 2 and 3C, the lowermost second local wordline of the stacked second local wordlines LWL2 may be electrically connected to the upper surface of the second wordline channel pillar 132b coupled to the second global wordline GWL2 closest to the second gate pattern 110c in the one row. Furthermore, the uppermost second local wordline of the stacked second local wordlines LWL2 may be electrically connected to the upper surface of the second wordline channel pillar 132b coupled to the second global wordline GWL2 farthest from the second gate pattern 110c in the one row. In the stacked second local wordlines LWL2, accordingly, the second local wordline located relatively high may further extend in the x-axis direction compared to the second local wordline located relatively low. The lower surface of each of the second local wordlines LWL2 may come in contact with the upper surface of the contact plug 159 or 159n, which may be coupled to the second wordline pad pattern 140b, by penetrating at least one of the insulating pattern 165a and the interlayer insulating layers 157 and/or 145.

In FIG. 2, the upper surfaces of the local bitline LBL and the contact plugs 137, 138, 147, 148, 149, 150, 159, and 159n are illustrated in the form of a rectangle. The inventive concept, however, is not limited thereto. The upper surfaces of the local bitline LBL and the contact plugs 137, 138, 147, 148, 149, 150, 159, and 159n may be embodied in the forms of an oval, circle, or polygon.

The stacked first local wordlines LWL1 are defined as a first stacked line part, and the stacked second local wordlines LWL2 are defined as a second stacked line part. A filling insulating pattern 167 may fill a space between the first and second stacked line parts. The upper surface of the filling insulating pattern 167 may be coplanar with the upper surface of the capping insulating patterns 165na and 165nb. The top of the local bitline LBL, which may protrude toward the third interlayer insulating layer 157, may penetrate the filling insulating pattern 167. For instance, the local bitline LBL may be disposed in a local bitline hole 174 sequentially penetrating the filling insulating pattern 167, the third interlayer insulating layer 157, and the first interlayer insulating layer 145. The variable resistor 176 may be interposed between an inner sidewall of the first local bitline hole 174 and the local bitline LBL.

The inter-line insulating patterns 165a and 165b and the capping insulating patterns 165na and 165nb extend laterally and may be disposed on the third interlayer insulating layer 157 of the third sub-region 56. The first and second inter-line insulating patterns 165a and 165b, which are located at substantially the same height in the third sub-region 56, laterally contact each other to form one inter-line insulating layer 165. Similarly, the first and second capping insulating patterns 165na and 165nb, which are disposed in the third sub-region 56, laterally contact each other to form one capping insulating layer 165n. In other words, the inter-line insulating layer 165 disposed in the third sub-region 56 may include extension parts of the first and second inter-line insulating patterns 165a and 165b, and the capping insulating layer 165n disposed in the third sub-region 56 may include extension parts of the first and second capping insulating patterns 165na and 165nb.

As illustrated in FIGS. 2 and 3B, the block selection signal line 249 may be coupled to the block selection doped region 106 located at one side of the block selection gate pattern 110b. The block selection signal line 249 may extend in a direction vertical to the upper surface of the semiconductor substrate 100. The block selection signal line 249 may be a pillar. The block selection signal line 249 may include a lower plug 248a, a buffer pad 248b, and an upper plug 248c. The lower plug 248a may come in contact with the block selection doped region 106 by sequentially penetrating the third, second, and first interlayer insulating layers 157, 145, and 112. The upper plug 248c may sequentially penetrate the capping insulating layer 165n, which may be disposed on the third interlayer insulating layer 157 in the third sub-region 56, and at least one inter-line insulating layer 165. The buffer pad 248b may be disposed between the lower plug 248a and the upper plug 248c. The buffer pad 248b may be formed of the same substance as the lowermost first local wordline LWL1. A wiring 252 may be disposed on the capping insulating layer 165n in the third sub-region 56. The wiring 252 may come in contact with the upper surface of the block selection signal line 249. The block selection signal line 249 may be coupled to the block selection circuit 270 illustrated in FIG. 1 through the wiring 252.

Plan views of one bitline transistor and one wordline transistor illustrated in FIG. 2 will described in more detail with reference to FIGS. 4A and 4B.

Figure 4A:
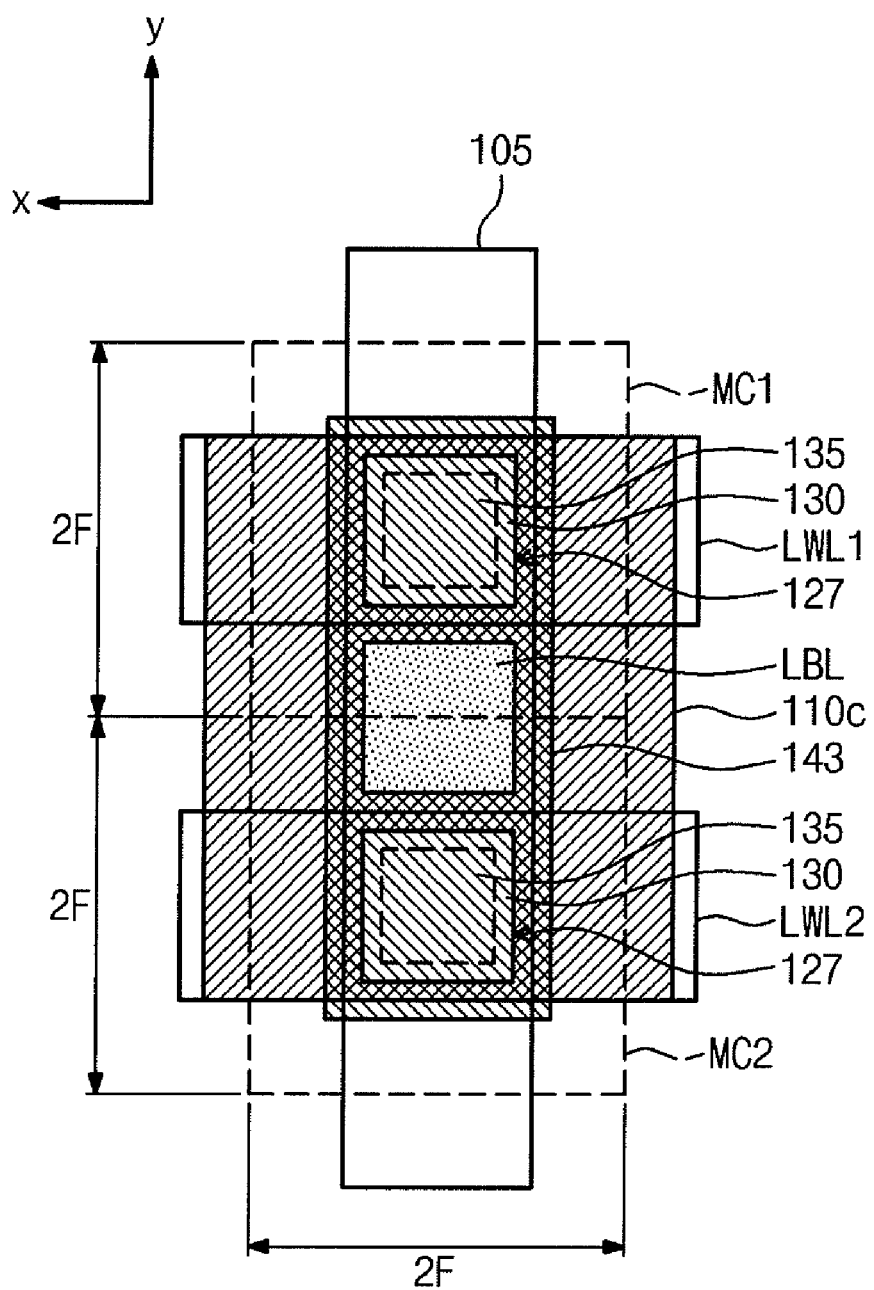
FIG. 4A is an enlarged plan view of a bitline transistor illustrated in FIG. 2.
Figure 4B:
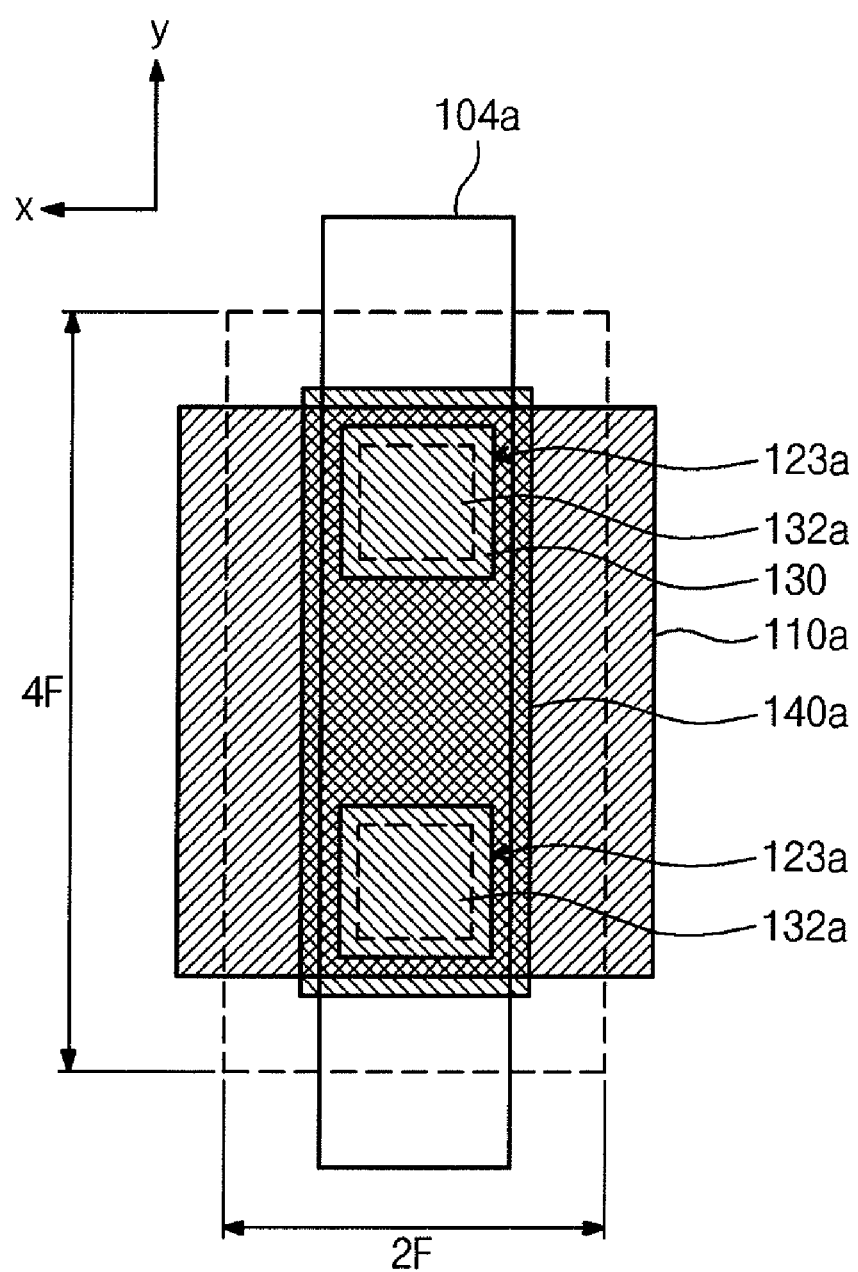
FIG. 4B is an enlarged plan view of a wordline transistor illustrated in FIG. 2.
Figure 5:
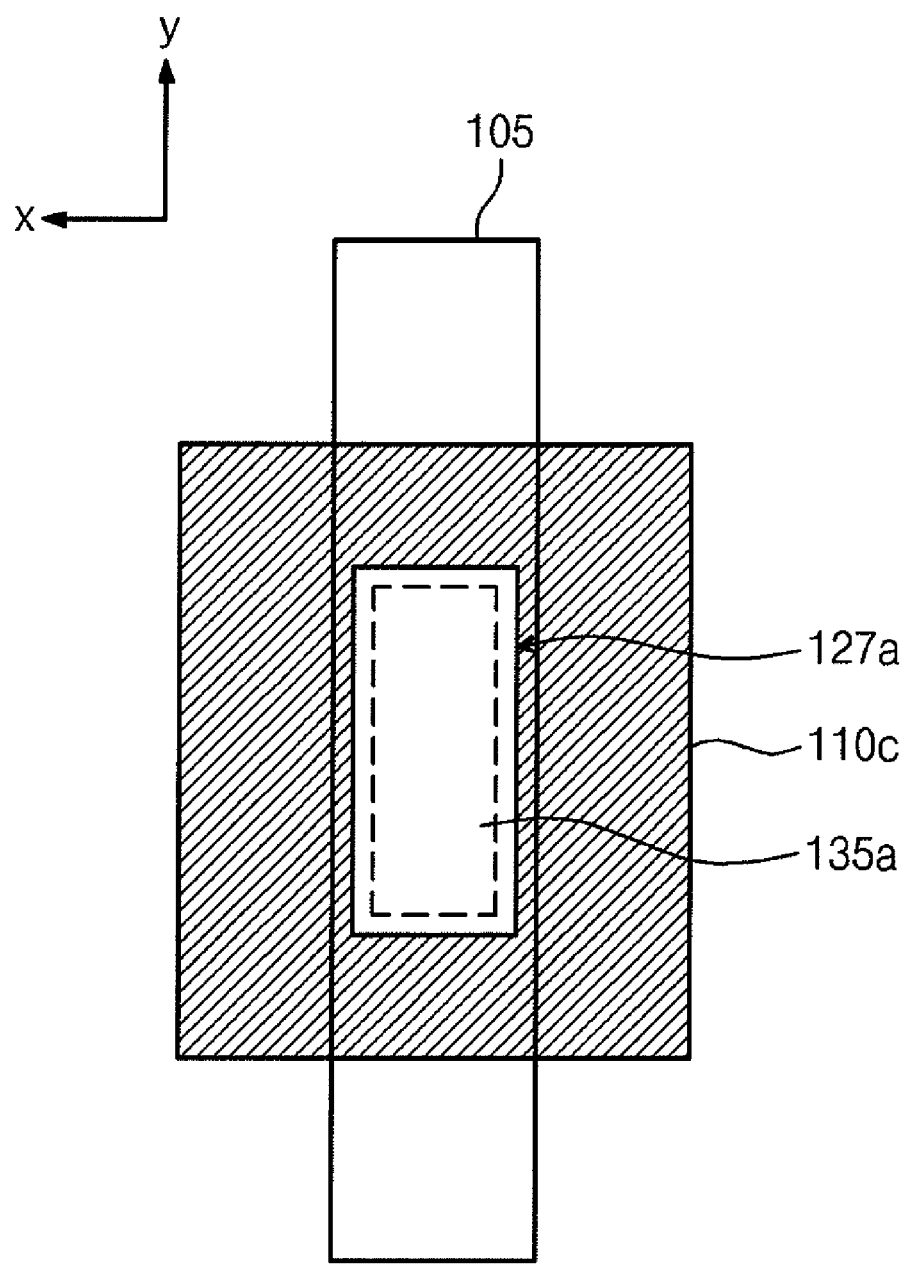
FIG. 5 is a plan view illustrating a modified example of a bitline channel hole included in the semiconductor memory device according to one embodiment of the inventive concept.

FIG. 4A is an enlarged plan view of the bitline transistor illustrated in FIG. 2; and FIG. 4B is an enlarged plan view of the wordline transistor illustrated in FIG. 2. FIG. 5 is a plan view illustrating a modified example of a bitline channel hole included in the semiconductor memory device according to one embodiment of the inventive concept.

Referring to FIG. 4A, one bitline transistor includes the second gate pattern 110c intersecting the bitline active portion 105 and at least one bitline channel pillar 135 coming in contact with the bitline active portion 105 by penetrating the second gate pattern 110c. As illustrated in FIG. 4A, the plurality of bitline channel pillars 135 may penetrate the second gate pattern 110c. The bitline pad pattern 143 may come in contact with the upper surface of the channel pillars 135. The local bitline LBL may be disposed on the bitline pad pattern 143, and the first and second wordlines LWL1 and LWL2 are disposed at the upper part of the second gate pattern 110c located at both sides of the local bitline LBL. As described above, the first memory cell MC1 may be formed at the intersection between the first local wordline LWL1 and the local bitline LBL, and the second memory cell MC2 may be formed at the intersection between the second local wordline LWL2 and the local bitline LBL. The first and second memory cells MC1 and MC2 share one local bitline LBL. For this reason, a planar region of the first memory cell MC1 may have a length of 2 F in the x-axis direction and a length of 2 F in the y-axis direction. Consequently, the first memory cell MC1 may have a planar region of $2 F^2$. In addition, the first and second memory cells MC1 and MC2 share one bitline transistor and may be disposed on the upper part of the bitline transistor. The bitline transistor has a vertical-type channel due to the bitline transistor pillar 135. For this reason, the planar region of the bitline transistor may be equal to the sum of the planar regions of the first and second memory cells MC1 and MC2. That is, the planar region of the bitline transistor may have a length of 2 F in the x-axis direction and 4 F in the y-axis direction. As a result, one bitline transistor may have a planar region of $8 F^2$. The second gate pattern 110c may have a length of 3 F in the y-axis direction.

According to the embodiment of the inventive concept, the bitline channel pillar 135 may have different shapes. As illustrated in FIG. 5, one bitline channel pillar 135a may penetrate the second gate pattern 110c. The one bitline channel pillar 135a may be disposed in one bitline channel hole 127a penetrating the second gate pattern 110c. In order to expand a channel width of the bitline transistor, the upper surface of the bitline channel pillar 135a may be a rectangular shape extending in the y-axis direction.

Referring subsequently to FIG. 4B, the first wordline transistor may include the first gate pattern 110a intersecting the first wordline active portion 104a and at least one first wordline channel pillar 132a penetrating the first gate pattern 110a. The first wordline transistor has a vertical-type channel due to the first wordline channel pillar 132a. For this reason, the first wordline transistor may be embodied to have the same planar region as the bitline transistor illustrated in FIG. 4A. Similarly, the planar region of the second wordline transistor and the bias transistor illustrated in FIG. 2 may be embodied to have the same planar region as the bitline transistor illustrated in FIG. 4A. The wordline transistors and the bias transistor may be formed in the same shape as the bitline transistor.

According to the above-described semiconductor memory device, the bitline transistor includes at least one bitline channel pillar 135 penetrating the second gate pattern 110c. In addition, the wordline transistor also includes at least one wordline channel pillar 132a or 132b penetrating the first gate pattern 110a. For this reason, the bitline transistor and the wordline transistor have a vertical-type channel. Consequently, a highly integrated semiconductor memory device can be formed.

Furthermore, the first and second memory cells MC1 and MC2 may share one local bitline LBL and one bitline transistor. As a result, the first memory cell MC1 having the planar region of $2 F^2$ and the second memory cell MC2 having the planar region of $2 F^2$ can be formed. In addition to this, since the first and second memory cells MC1 and MC2 share one bitline transistor and the bitline transistor has the vertical-type channel, the planar region of the bitline transistor may be equal to the sum of the planar regions of the first and second memory cells MC1 and MC2. Consequently, the bitline transistor obtains amounts of sufficient turn-on current and may prevent the planar region from being enlarged by the bitline transistor.

In addition, the first gate pattern 110a including the gate of the wordline transistor and the second gate pattern 110c including the gate of the bitline transistor may be coupled by the bias transistor. As a result, the first and second gate patterns 110a and 110c can be controlled by a single block selection signal.

A method of forming the semiconductor memory device according to one embodiment of the inventive concept will now be described with reference to the accompanying drawings.

FIGS. 6A, 7A, 8A, 9A, 10A, and 11A, respectively, are cross-sectional views taken along line I-I' of FIG. 2 and describe a method of forming the semiconductor memory device according to one embodiment of the inventive concept. FIGS. 6B, 7B, 8B, 9B, 10B, and 11B, respectively, are cross-sectional views taken along line III-III' of FIG. 2 and describe a method of forming the semiconductor memory device according to one embodiment of the inventive concept.

Figure 6B:
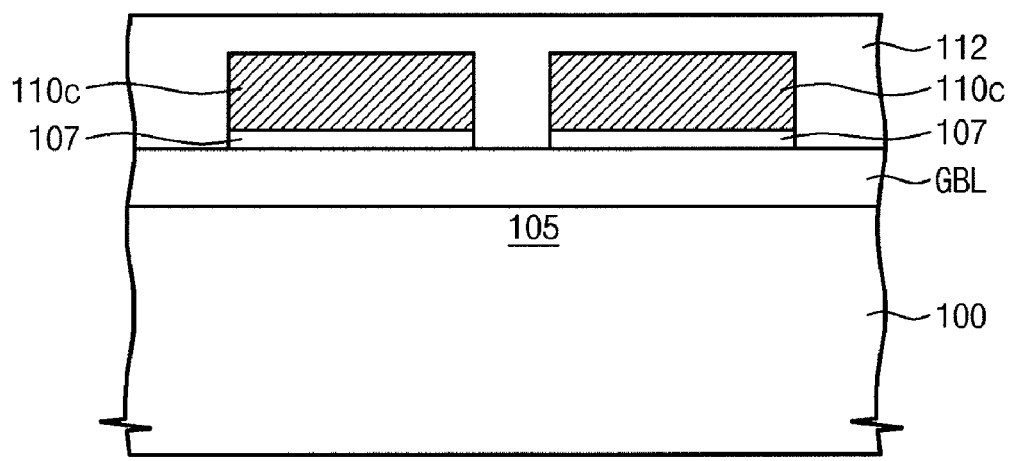
FIGS. 6B, 7B, 8B, 9B, 10B, and 11B are cross-sectional views taken along line III-III' of FIG. 2 to describe a method of forming the semiconductor memory device according to one embodiment of the inventive concept, respectively.

With reference to FIGS. 6A and 6B, the semiconductor substrate 100 including the first region 50 and the second region 60 is prepared. The first region 50 may include the first sub-region 52, the second sub-region 54, and the third sub-region 56. The second sub-region 54 and the third sub-region 56 are disposed at both sides of the first sub-region 52, respectively. The device isolation pattern 102 may be formed on the semiconductor substrate 100 to define the active portions 104a, 104b, 104c, 104d, and 105. The first wordline active portions 104a, the second wordline active portions 104b, the bias active portion 104c, and the block selection active portions 104d are defined in the first region 50. The first wordline active portions 104a and the second wordline active portions 104b may be alternately disposed in the first sub-region 52. The bias active portion 104c may be disposed in the second sub-region 54, and the block selection active portion 104d may be disposed in the third sub-region 56. The active portions 104a, 104b, 104c, 104d, and 105 may be doped with the first-type dopant.

The second-type dopant ion may be implanted into the active portions 104a, 104b, 104c, 104d, and 105 and may form the first global wordline GWL1, the second global wordline GWL2, the bias line 242, the block selection doped region 106, and the global bitline GBL.

Subsequently, an insulating layer and a gate conductive layer may be sequentially formed on substantially the entire surface of the semiconductor substrate 100. By successively patterning the gate conductive layer and the insulating layer, the first gate pattern 110a, the block selection gate pattern 110b, and the second gate pattern 110c may be formed. Furthermore, the insulating pattern 107 may be formed so as to be interposed between the gate patterns 110a, 110b, and 110c and the semiconductor substrate 100. The gate patterns 110a, 110b, and 110c contain a conductive substance. For instance, the gate patterns 110a, 110b, and 110c may contain at least one selected from a doped-semiconductor substance, conductive metal nitrides (for example, titanium nitride or tantalum nitride), metal silicides (for example, tungsten silicide or cobalt silicide), and metals (for example, titanium, tantalum, or tungsten). The insulating pattern 107 may contain oxides.

The first interlayer insulating layer 112 may be formed on the semiconductor substrate 100 having the gate patterns 110a, 110b, and 110c. The first interlayer insulating layer 112 may have a planarized upper surface.

Figure 7A:
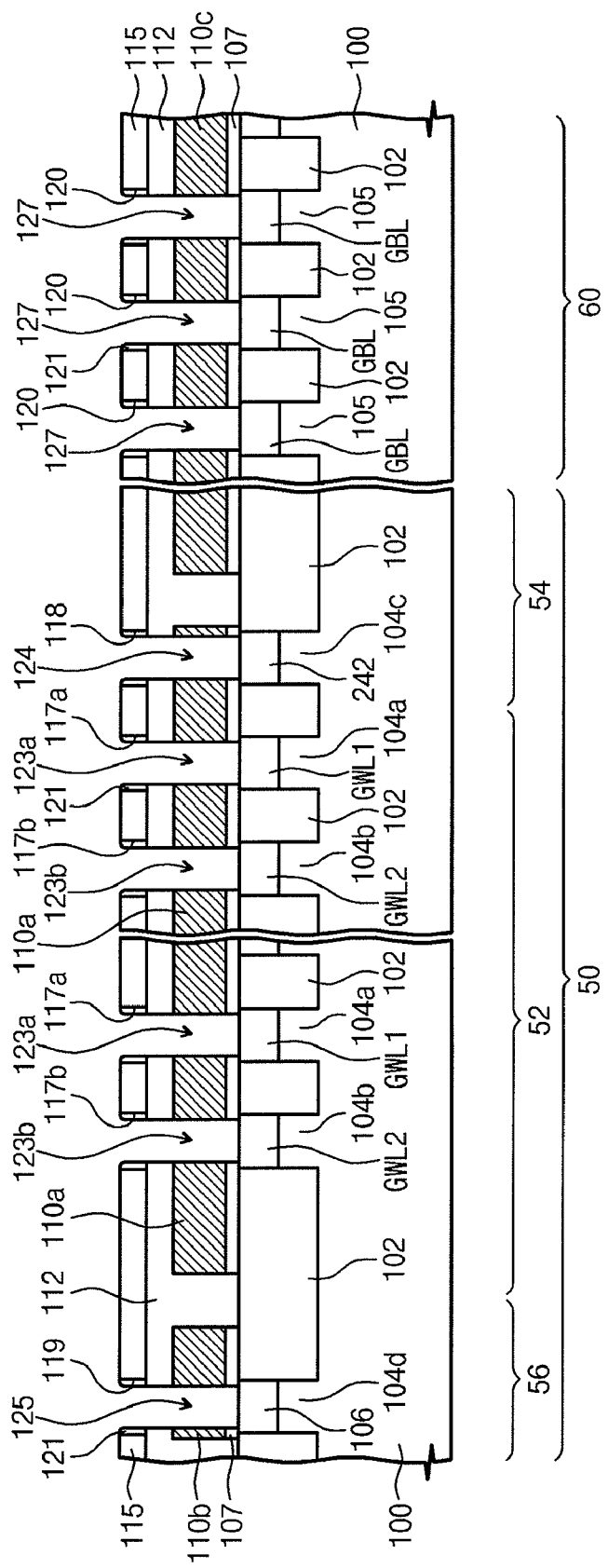
Figure 7B:
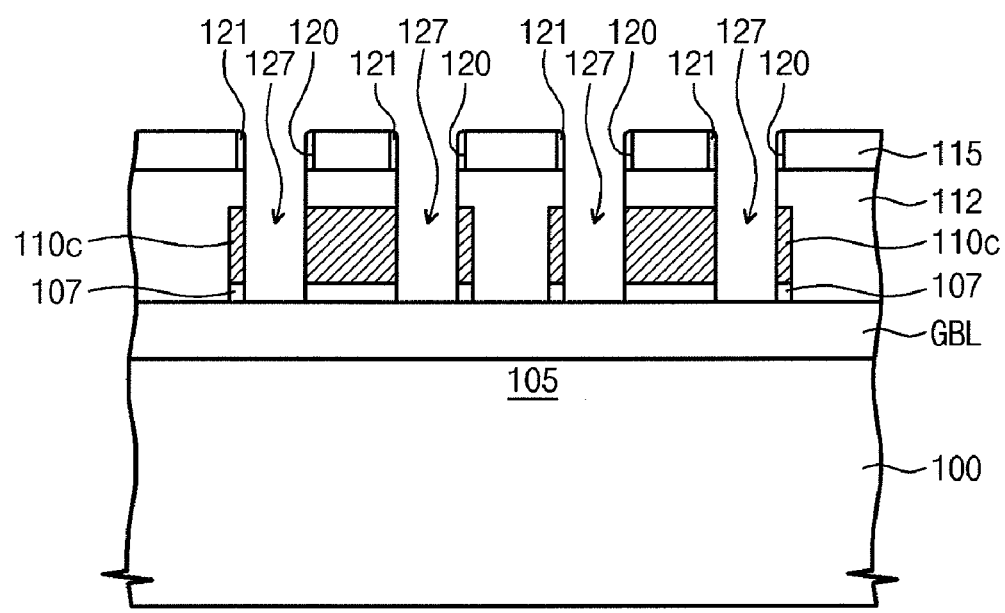

Referring to FIGS. 7A and 7B, mask patterns 115 having openings 117a, 117b, 118, 119, and 120 may be formed on the first interlayer insulating layer 112. The mask patterns 115 may contain a substance having an etch selectivity with respect to the first interlayer insulating layer 112, the gate patterns 110a, 110b, and 110c, and the insulating pattern 107. For instance, the first interlayer insulating layer 112 may contain a photosensitive substance and/or a hard mask substance. When the first interlayer insulating layer 112 and the insulating pattern 107 may be formed of oxides, the hard mask substance may be nitrides or oxynitrides. Channel holes are defined by the first openings 117a, 117b, 118, 119, and 120. At least one first opening 117a may be formed at a region in which the first gate pattern 110a and the first wordline active portion 104a may be overlapped with each other, and at least a second opening 117b may be formed at a region in which the first gate pattern 110a and the second wordline active portion 104b may be overlapped with each other. At least a third opening 118 may be formed at a region in which the first gate pattern 110a and the bias active portion 104c may be overlapped with each other, and at least a fourth opening 119 may be formed at a region in which a block selection gate pattern 110b and a block selection active portion 104d may be overlapped with each other. At least a fifth opening 120 may be formed at a region in which the second gate pattern 110c and the bitline active portion 105 may be overlapped with each other. The first interlayer insulating layer 112 may be exposed by the openings 117a, 117b, 118, 119, and 120.

Each of the openings 117a, 117b, 118, 119, and 120 may have a width of 1 F, which is a minimum line width of a design rule. Spacers 121 may be formed at inner sidewalls of the openings 117a, 117b, 118, 119, and 120. The spacers 121 may contain a substance having an etch selectivity with respect to the first interlayer insulating layer 112, the gate patterns 110a, 110b, and 110c, and the insulating pattern 107. For instance, when the first interlayer insulating layer 112 and the insulating layer 107 may be formed of oxides, the spacers may contain nitrides or oxynitrides.

Using the mask patterns 115 and the spacers 121 as an etch mask, the first interlayer insulating layer 112, the gate patterns 110a, 110b, and 110c, and the insulating pattern 107 may be sequentially etched. For this reason, channel holes 123a, 123b, 124, 125, and 127 are formed. The first wordline channel hole 123a may be formed below the first opening 117a to expose the first wordline active portion 104a, and the second wordline channel hole 123b may be formed below the second opening 117b to expose the second wordline active portion 104b. The third wordline channel hole 124 may be formed below the third opening 118 to expose the bias active portion 104c, and the block selection channel hole 125 may be formed below the fourth opening 119 to expose the block selection active portion 104d. The bitline channel hole 127 may be formed below the fifth opening 120 to expose the bitline active portion 105. By the channel holes 123a, 123b, 124, 125, and 127, the first global wordline GWL1, the second global wordline GWL2, the bias line 242, the block selection doped region 106, and the global bitline GBL, which are formed in the active portions 104a, 104b, 104c, 104d, and 105, are exposed. Due to the spacers 121 on the inner sidewalls of the openings 117a, 117b, 118, 119, and 120, each of the channel holes 123a, 123b, 124, 125, and 127 may have a width narrower than 1 F, which is a minimum line width of a design rule. As a result, it can obtain the alignment margin between the channel holes 123a, 123b, 124, 125, and 127 and the gate patterns 110a, 110b, and 110c.

Figure 8A:
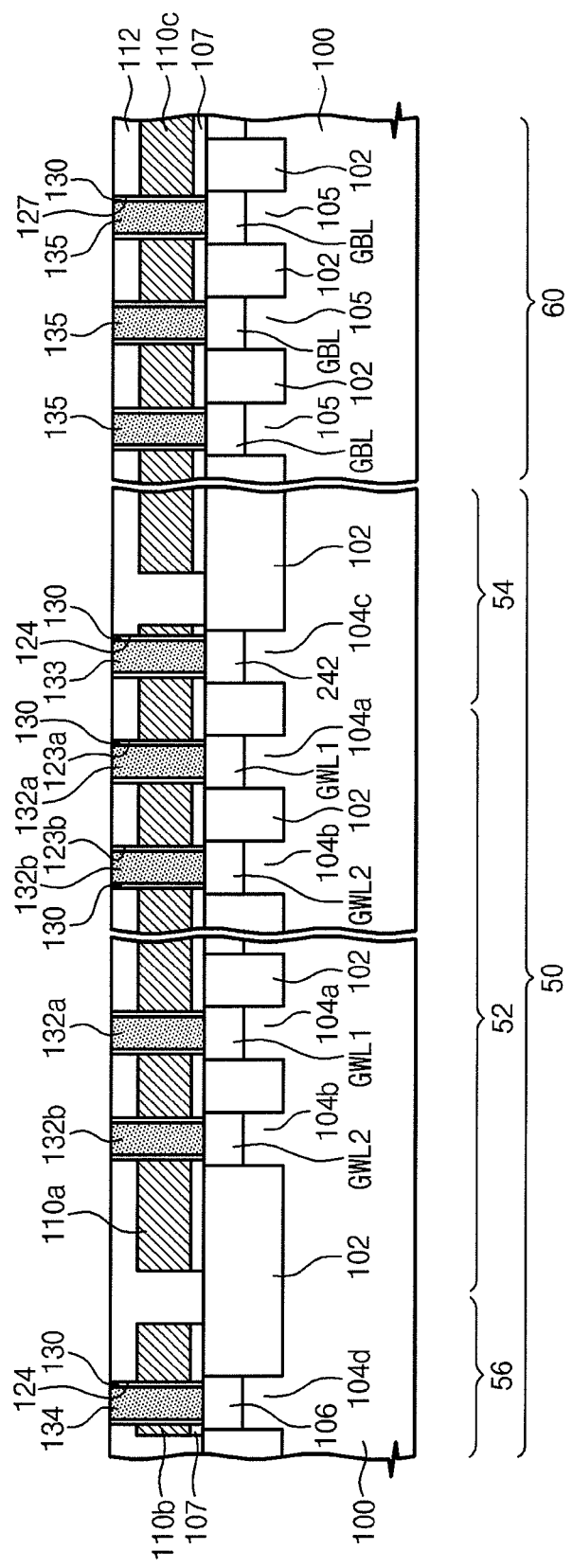
Figure 8B:
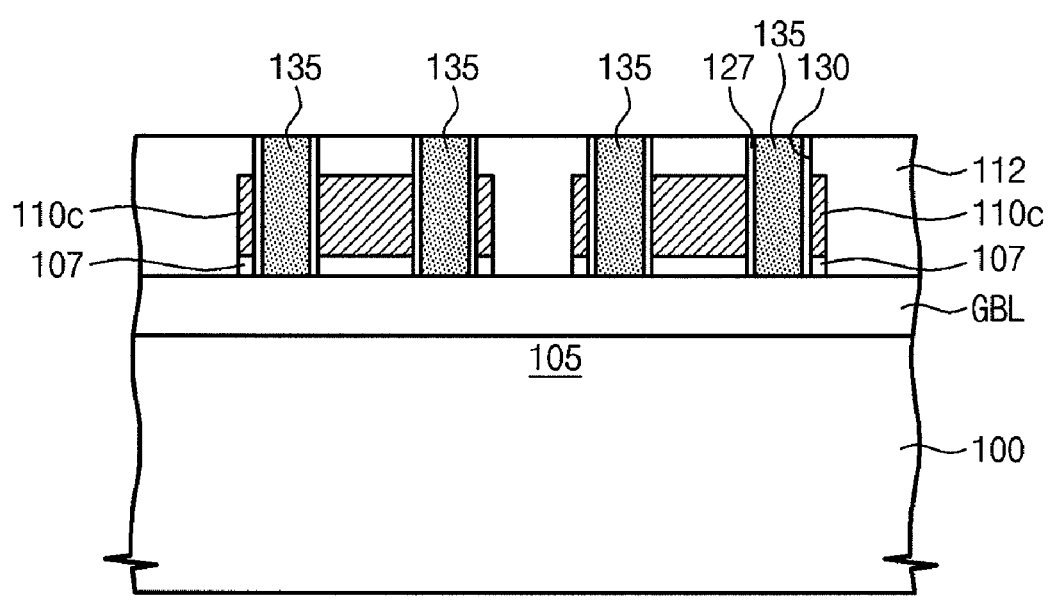

With reference to FIGS. 8A and 8B, after the channel holes 123a, 123b, 124, 125, and 127 are formed, the mask patterns 115 and the spacers 121 may be removed. Subsequently, the gate insulating patterns 130 may be formed at inner sidewalls of the channel holes 123a, 123b, 124, 125, and 127. The gate insulating patterns 130 may contain oxides, nitrides, oxynitrides, and/or high-dielectric substances. A method of forming the gate insulating patterns 130 will be described. A gate insulating layer may be conformally formed on substantially the entire surface of the semiconductor substrate 100 having the channel holes 123a, 123b, 124, 125, and 127. The gate insulating layer may be formed on the inner sidewalls and bottoms of the channel holes 123a, 123b, 124, 125, and 127 and on the upper surface of the first interlayer insulating layer 112. The gate insulating layer may be formed by, for example, a Chemical Vapor Deposition (CVD) or Atomic Layer Deposition (ALD). The gate insulating layer on the bottoms of the channel holes 123a, 123b, 124, 125, and 127 may be then removed to expose the active portions 104a, 104b, 104c, 104d, and 105. At this time, since the gate insulating layer on the inner sidewalls of the channel holes 123a, 123b, 124, 125, and 127 remains, the gate insulating patterns 130 may be formed. The gate insulating layer on the bottoms of the channel holes 123a, 123b, 124, 125, and 127 may be removed by an anisotropic etching. At this time, the gate insulating layer on the first interlayer insulating layer 112 may also be removed.

The channel pillars 132a, 132b, 133, 134, and 135 are formed in the channel holes 123a, 123b, 124, 125, and 127 to come in contact with the exposed active portions 104a, 104b, 104c, 104d, and 105, respectively. The channel pillars 132a, 132b, 133, 134, and 135 may be formed of semiconductor substances. The channel pillars 132a, 132b, 133, 134, and 135 may be formed in a single-crystalline state by a selective epitaxial growth. In this case, the upper surfaces of the channel pillars 132a, 132b, 133, 134, and 135 may be substantially coplanar with the upper surface of the first interlayer insulating layer 112 by a planarization process.

Alternatively, a semiconductor layer may be formed to fill the channel holes 123a, 123b, 124, 125, and 127. After the semiconductor layer is deposited in an amorphous state, crystallization heat treatment may be carried out on the semiconductor layer. The semiconductor layer may be planarized until the first interlayer insulating layer 112 is exposed, resulting in forming the channel pillars 132a, 132b, 133, 134, and 135.

The channel pillars 132a, 132b, 133, 134, and 135 may be in an undoped state. Unlike this, the channel pillars 132a, 132b, 133, 134, and 135 may be doped with a dopant (that is, the first-type dopnant) different from that of the global wordline lines GWL1 and GWL2, the bias line 242, the block selection doped region 106, and the global bitline GBL. The channel pillars 132a, 132b, 133, 134, and 135 may be doped in-situ or through ion implantation.

Figure 9A:
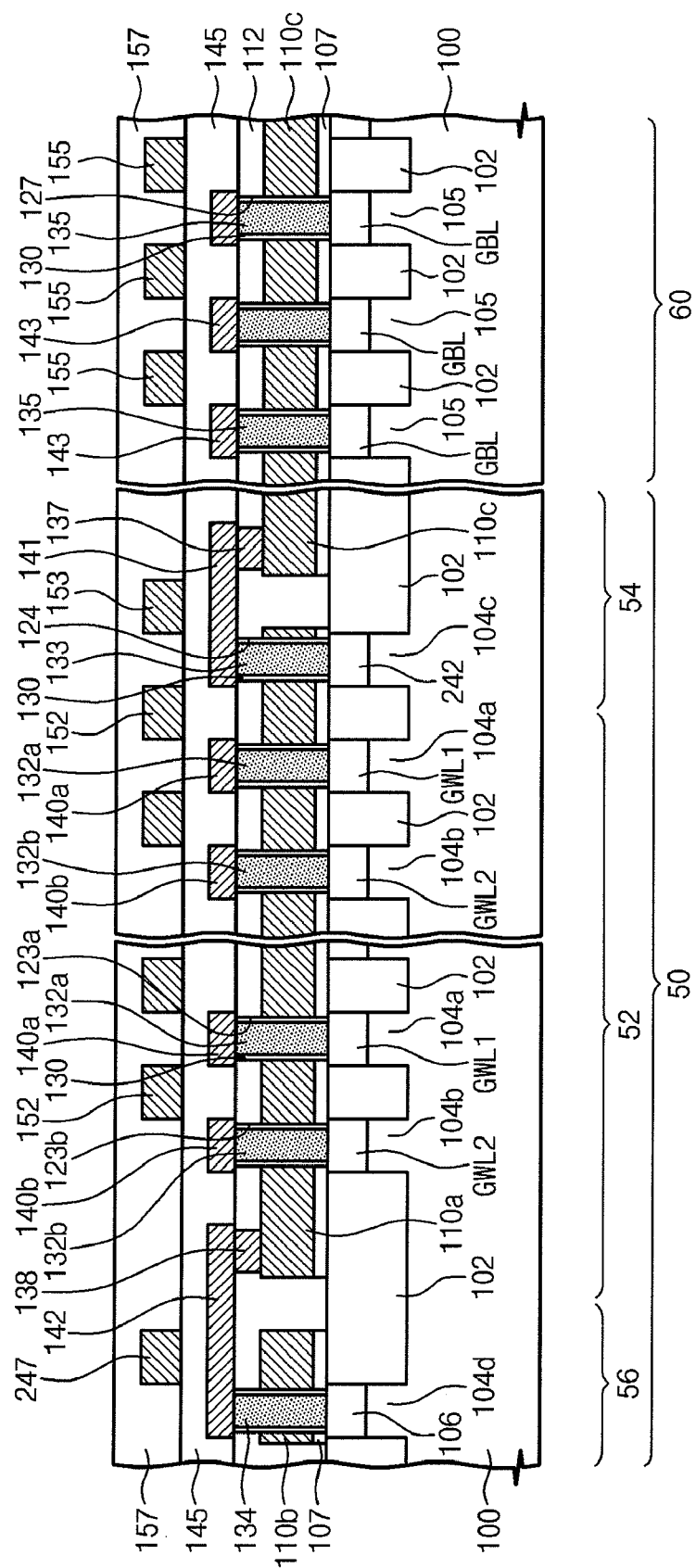
Figure 9B:
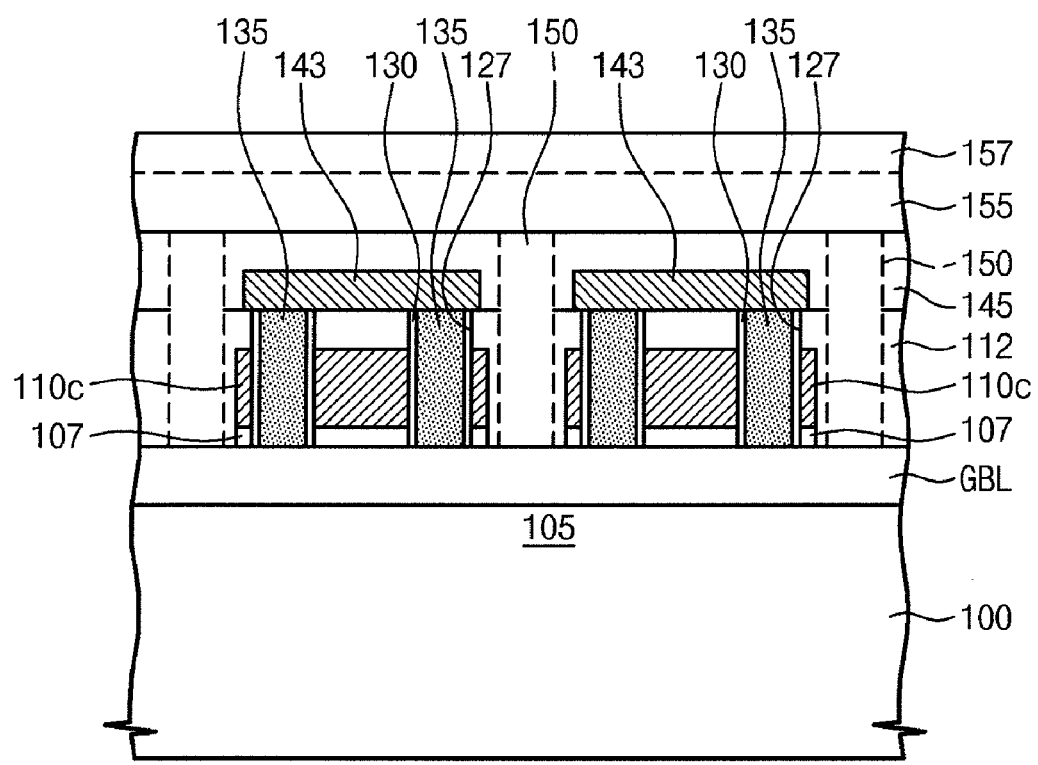

Referring to FIGS. 9A and 9B, the first gate contact plug 137 and the second gate contact plug 138 are formed. The first gate contact plug 137 comes in contact with the second gate pattern 110c by penetrating the first interlayer insulating layer 112, and the second contact plug 138 comes in contact with the first gate pattern 110a by penetrating the first interlayer insulating layer 112. Contact holes may be formed using the spacers 121 as shown in FIG. 7A. The contact holes are used to form the gate contact plugs 137 and 138. Therefore, the gate contact plugs 137 and 138 may have a width narrower than 1 F. The gate contact plugs 137 and 138 may be formed after the channel pillars 132a, 132b, 133, 134, and 135 are formed. A conductive layer may be then formed on the first interlayer insulating layer 112, and pad patterns 140a, 140b, 141, 142, and 143 are formed by patterning the conductive layer. Since the shapes and functions of the pad patterns 140a, 140b, 141, 142, and 143 are described with reference to FIGS. 2, 3A, 3B, 3C, and 3D, the detailed description will be omitted. The pad patterns 140a, 140b, 141, 142, and 143 may contain at least one selected from a doped-semiconductor substance, metals (for example, titanium, tantalum, or tungsten), conductive metal nitrides (for example, titanium nitride or tantalum nitride), and metal silicides (for example, tungsten silicide or cobalt silicide).

According to some embodiment of the inventive concept, the channel pillars 132a, 132b, 133, 134, and 135 may be formed after the gate contact plugs 137 and 138 are formed. Then the pad patterns 140a, 140b, 141, 142, and 143 may be formed on the resulting structure.

The second interlayer insulating layer 145 is formed on the pad patterns 140a, 140b, 141, 142, and 143 and the first interlayer insulating layer 112. Subsequently, the third gate contact plug 149 (see FIGS. 2 and 3B) and the strapping contact plugs 147, 148, and 150 (see FIGS. 2 and 3B) may be formed to sequentially penetrate the second and first interlayer insulating layers 145 and 112. The contact holes for the third gate contact plug 149 and the strapping contact plugs 147, 148 and 150 may be formed to have a width smaller than 1 F using the above-described spacer 121.

Then, the block selection gate line 247 and the strapping lines 152, 153, and 155 may be formed on the second interlayer insulating layer 145. The block selection gate line 247 may come in contact with the third gate contact plug 149 (see FIGS. 2 and 3B), and the strapping lines 152, 153, and 155 may be coupled to the strapping contact plugs 147, 148, and 150 (see FIGS. 2 and 3B), respectively. Subsequently, the third interlayer insulating layer 157 may be formed on substantially the entire surface of the semiconductor substrate 100.

According to some embodiments of the inventive concept, the block selection gate line 247 and the strapping lines 152, 153, and 155 are formed before the second interlayer insulating layer 145 may be formed, whereas the channel pillars 132a, 132b, 133, 134, and 135 and the pad patterns 140a, 140b, 141, 142, and 143 may be formed after the second interlayer insulating layer 145 may be formed. In this case, the channel holes 123a, 123b, 124, 125, and 127 continuously penetrate the second and first interlayer insulating layers 145 and 112, the gate patterns 110a, 110b, and 110c, and the insulating pattern 107. Moreover, the first and second gate contact plugs 137 and 138 may continuously penetrate the second and first interlayer insulating layers 145 and 112.

Figure 10A:
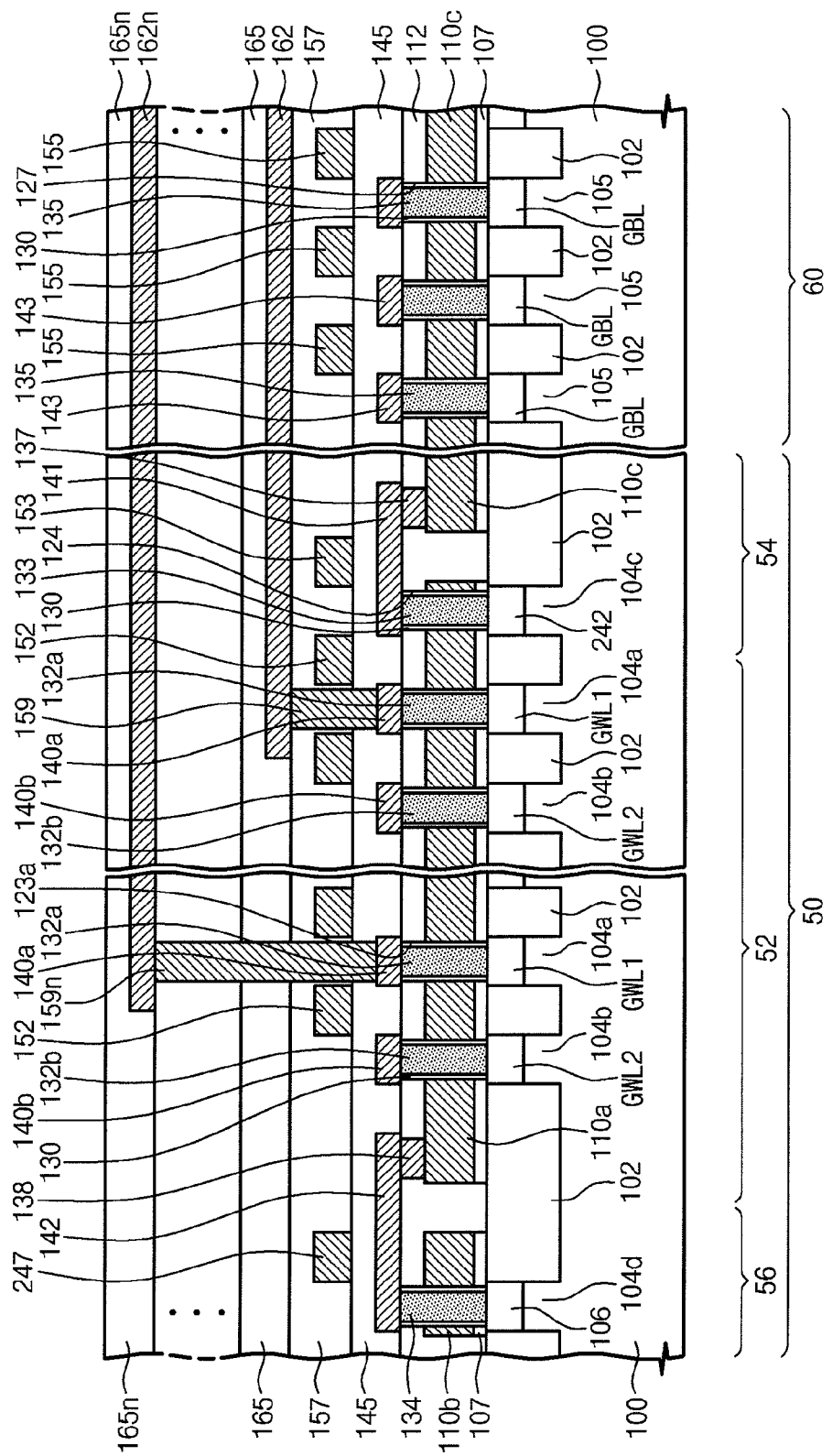
Figure 10B:
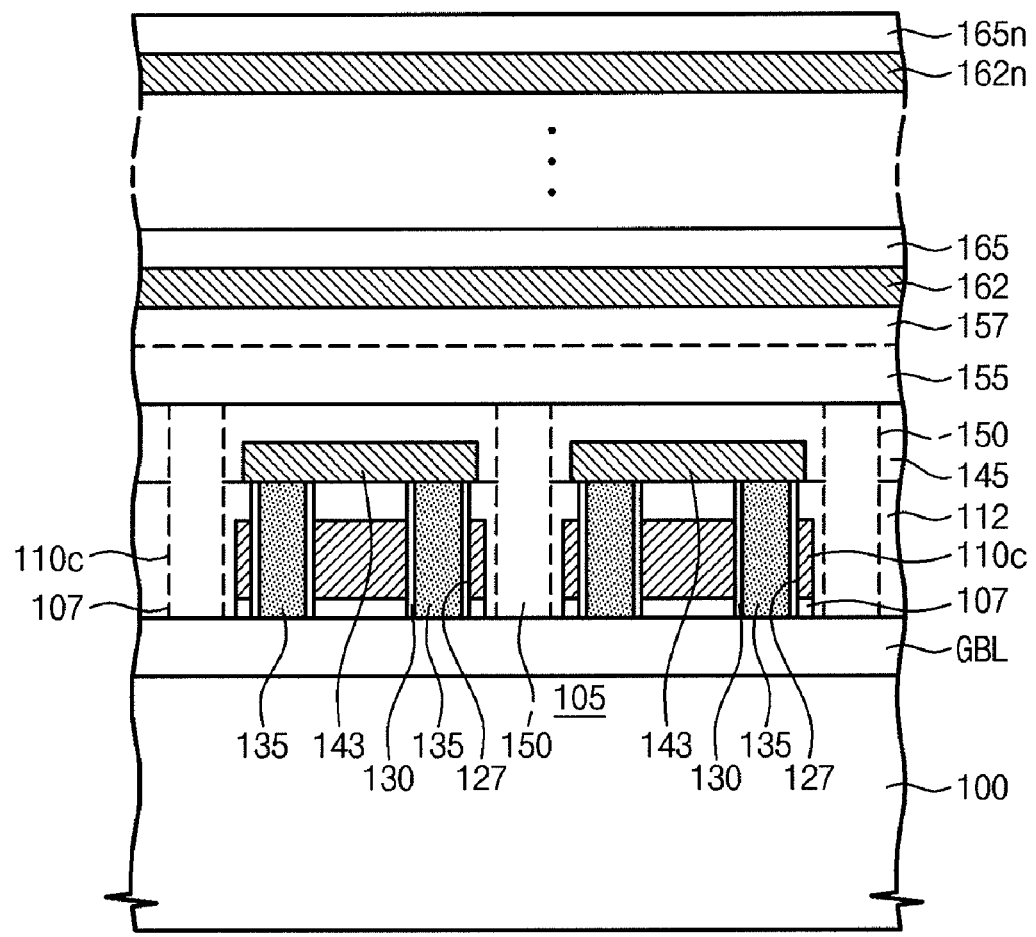

With reference to FIGS. 10A and 10B, two contact plugs 159 may be formed to correspond to one of the first gate patterns 110a by penetrating the third and second interlayer insulating layers 157 and 145. Two contact plugs 159 may be coupled to one of the first wordline pad patterns 140a and one of the second wordline pad patterns 140b, respectively, which may be disposed at the upper part of the first gate pattern 110a. The contact plug 159 coupled to the second wordline pad pattern 140b is illustrated in FIG. 2. The contact plug 159 may contain at least one selected from metals (for example, titanium, tantalum, or tungsten) and/or conductive metal nitrides (for example, titanium nitride or tantalum nitride).

The conductive layer may be formed on substantially the entire surface of the semiconductor substrate 100 having the contact plug 159, and a conductive pattern 162 may be formed by patterning the conductive layer. The conductive pattern 162 comes in contact with the upper surfaces of two contact plugs 159 corresponding to the first gate pattern 110a. The conductive pattern 162 may wholly cover at least the second region 60. In addition, the conductive pattern 162 may wholly cover the second sub-region 54 and partially cover the first sub-region 52. The inter-line insulating layer 165 may be formed on the semiconductor substrate 100 having the conductive pattern 162.

Subsequently, two contact plugs (not illustrated) may be formed and coupled to the other of the first wordline pad patterns 140a and the other of the second wordline pad patterns 140b located at the upper part of the first gate pattern 110a. The conductive pattern and the inter-line insulating layer may be formed and coupled to these two contact plugs. A capping insulating layer 165n n may be formed to cover substantially the entire surface of the semiconductor substrate 100 after the uppermost conductive pattern 162n may be formed.

The contact plug 159, which may be coupled to the conductive pattern located higher than the lowermost conductive pattern 162, may sequentially penetrate the inter-line insulating layer and the third and second interlayer insulating layers 157 and 145. The lower plug 248a of the block selection signal line 249 illustrated in FIG. 3B may be formed together with the contact plug 159 coupled to the lowermost conductive pattern 162. Furthermore, the buffer pad 248b of the block selection signal line 249 illustrated in FIG. 3B may be formed together with the lowermost conductive pattern 162.

The contact plugs 159 coupled to the lowermost conductive pattern 162 of the conductive patterns may be coupled to the first wordline pad pattern 140a and the second wordline pad pattern 140b closest to the second gate pattern 110c, respectively. The contact plugs 159n coupled to the uppermost conductive pattern 162 of the conductive patterns may be coupled to the first wordline pad pattern and the second wordline pad pattern farthest from the second gate pattern 110c, respectively. As a result, the conductive pattern located relatively high may have a wider planar region than the conductive pattern located relatively low.

Figure 11A:
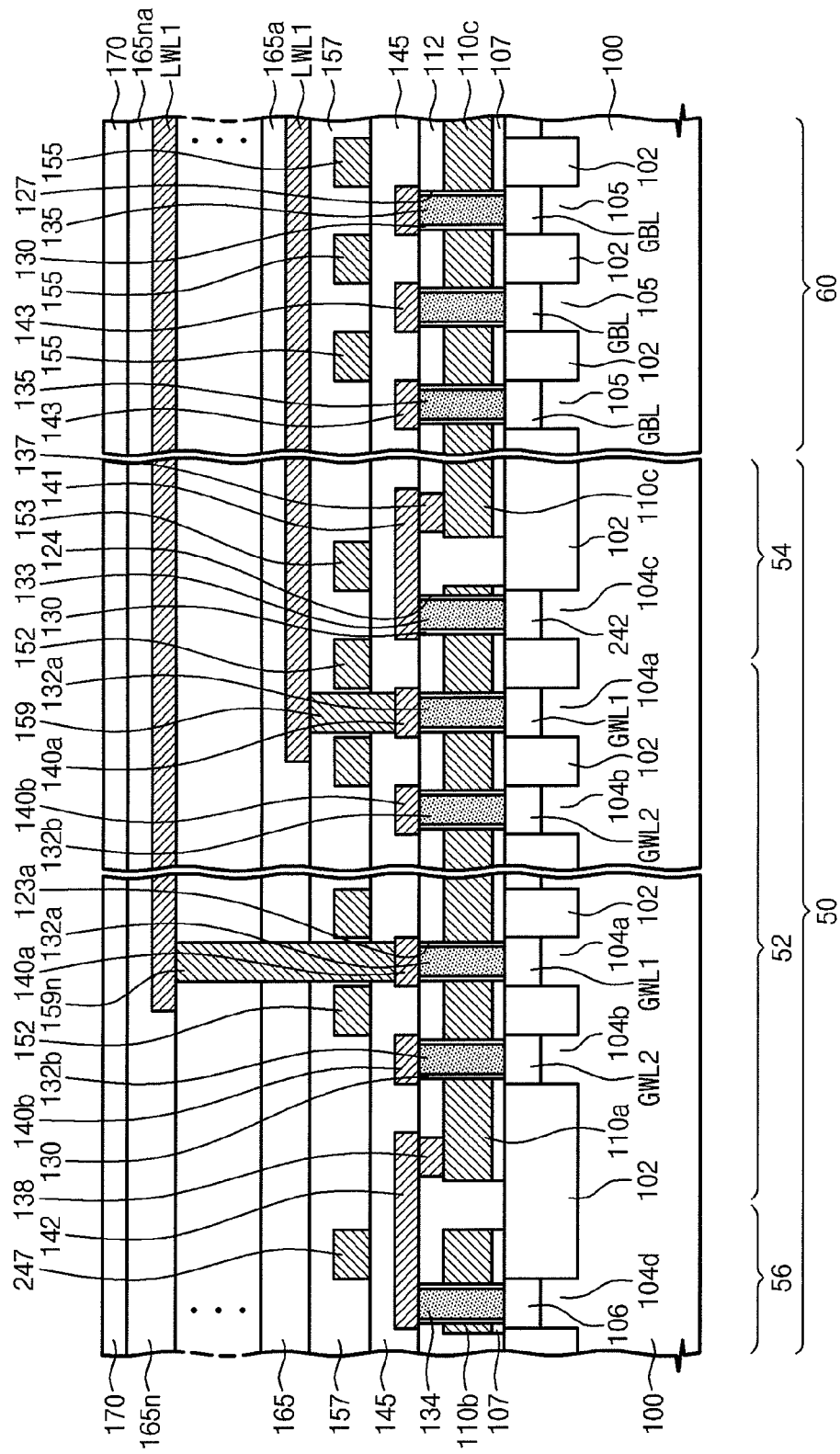
Figure 11B:
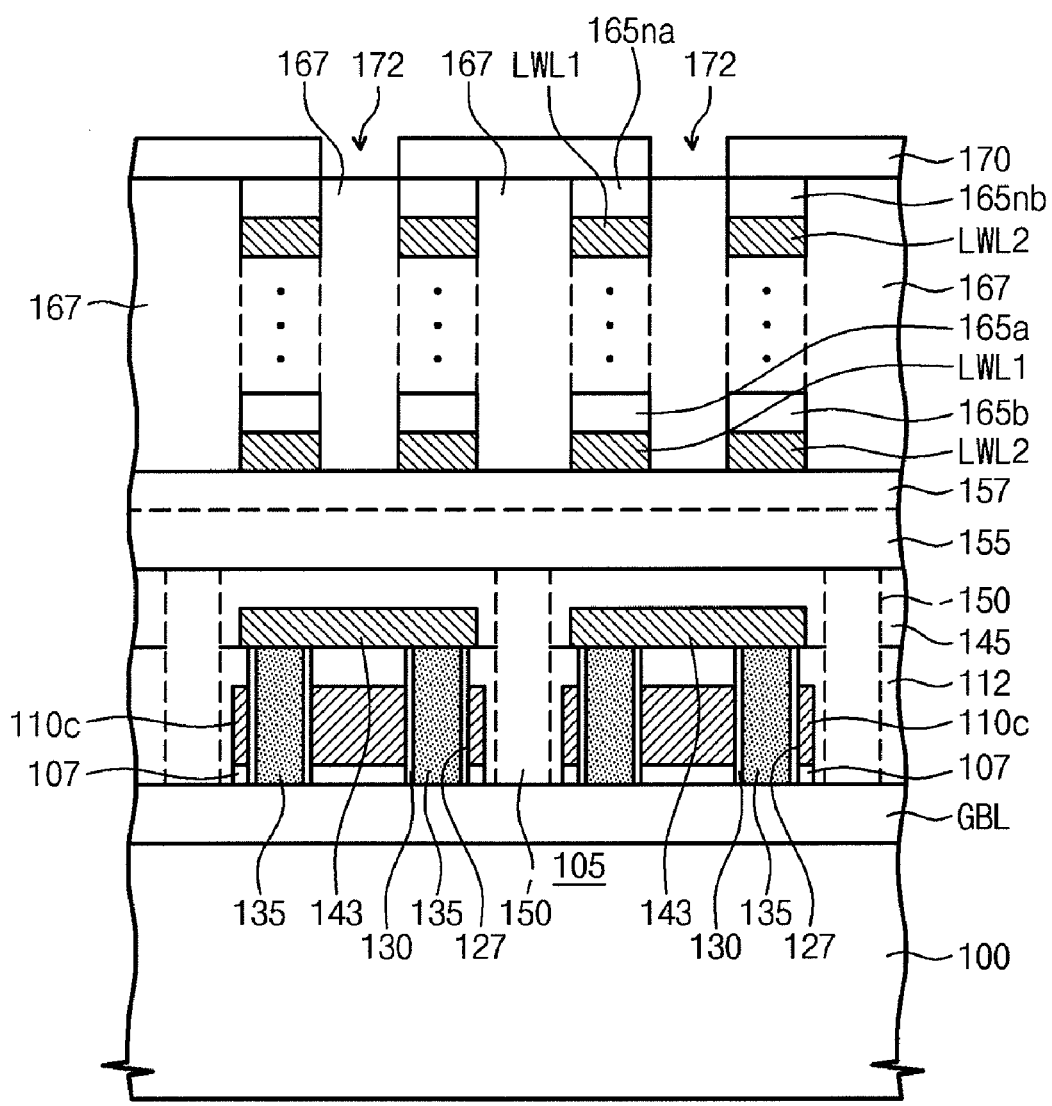

Referring to FIGS. 11A and 11B, the plurality of stacked first local wordlines LWL1, the first inter-line patterns 165a between the stacked first local wordlines LWL1, and the first capping insulating pattern 165na may be formed by sequentially patterning the capping insulating layer 165n, the conductive patterns 159n and 159, and the inter-line insulating layer 165. At this time, the plurality of stacked second local wordlines LWL2, the second inter-line patterns 165b between the stacked second local wordlines LWL2, and the second capping insulating pattern 165na may be simultaneously formed. The third interlayer insulating layer 157 between the stacked first local wordlines LWL1 and the stacked second local wordlines LWL2 may be exposed. The third interlayer insulating layer 157 may contain an insulating substance having an etch selectivity with respect to the inter-line insulating layer. The stacked inter-line insulating layers 165 and the capping insulating layer 165n may remain on the third interlayer insulating layer 157 of the third sub-region 56.

Then, a filling insulating layer (not illustrated) may be formed on substantially the entire surface of the semiconductor substrate 100 to fill the space between the stacked first local wordlines LWL1 and the stacked second local wordlines LWL2. The filling insulating layer may be planarized until the capping insulating patterns 165na and 165nb are exposed. Accordingly, the filling insulating pattern 167 may be formed to fill the space. The capping insulating patterns 165na and 165nb may contain an insulating substance having an etch selectivity with respect to the filling insulating pattern 167. For instance, the capping insulating patterns 165na and 165nb contain nitrides or oxynitrides, and the filling insulating pattern 167 may be formed of oxides.

Subsequently, the mask pattern 170 may be formed on the semiconductor substrate 100. The mask pattern 170 has an opening 172 to define the local bitline hole 174 illustrated in FIG. 3C. The opening 172 may expose the upper part of the bitline pad pattern 143 and the filling insulating pattern 167 between the first and second local wordlines LWL1 and LWL2.

The local bitline hole 174 illustrated in FIG. 3C may be formed by sequentially etching the filling insulating pattern 167, the third interlayer insulating layer 157, and the second interlayer insulating layer 145 using the mask pattern 170 as an etching mask. The local bitline hole (see FIG. 3C) may expose the bitline pad pattern 143. Then, the mask pattern 170 may be removed, and a variable resistor layer may be conformally formed on the entire surface of the semiconductor substrate 100. The variable resistor layer may be disposed on the sidewall and bottom of the local bitline hole 174. The bitline pad pattern 143 may be exposed by removing the variable resistor layer disposed on the bottom of the local bitline hole 174. At this time, a variable resistor layer 176 on the inner sidewall of the local bitline hole 174 remains. Subsequently, the local bitline LBL illustrated in FIGS. 2 and 3C may be formed to fill the local bitline hole 174.

The upper plug 248c may be formed to sequentially penetrate the capping insulating layer 165n and the inter-line insulating layers 165 in the third sub-region 56. The upper plug 248c may come in contact with the buffer pad 248b of FIG. 3B. The upper plug 248c of FIG. 3B may be formed before or after the local bitline LBL is formed. Unlike this, the upper plug 248c of FIG. 3B may be formed together with the local bitline LBL. When the upper plug 248c and the local bitline LBL are simultaneously formed, the upper plug 248c and the local bitline LBL may be formed of the same substance, also the variable resistor layer 176 may be disposed at the sidewall of the upper plug 248c and between the insulating layers 159 and 159n of the third sub-region 56.

The semiconductor memory device illustrated in FIGS. 2 and 3A through 3D may be implemented by the above-described methods.

The semiconductor memory device according to the above-described embodiments may be realized in various types of semiconductor packages. For example, the semiconductor memory device according to some embodiments of the inventive concept may be packaged using methods such as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small-outline integrated circuit (SOIC), shrink small-outline package (SSOP), thin small-outline package (TSOP), thin quad flat pack (TQFP), system in package (SIP), multi chip package (MCP), wafer-level fabricated package (WFP), or wafer-level processed stack package (WSP). A package mounted with the semiconductor memory device according to some embodiments of the inventive concept may further include a controller and/or a logic device, for example, controlling the semiconductor memory device.

Figure 12:
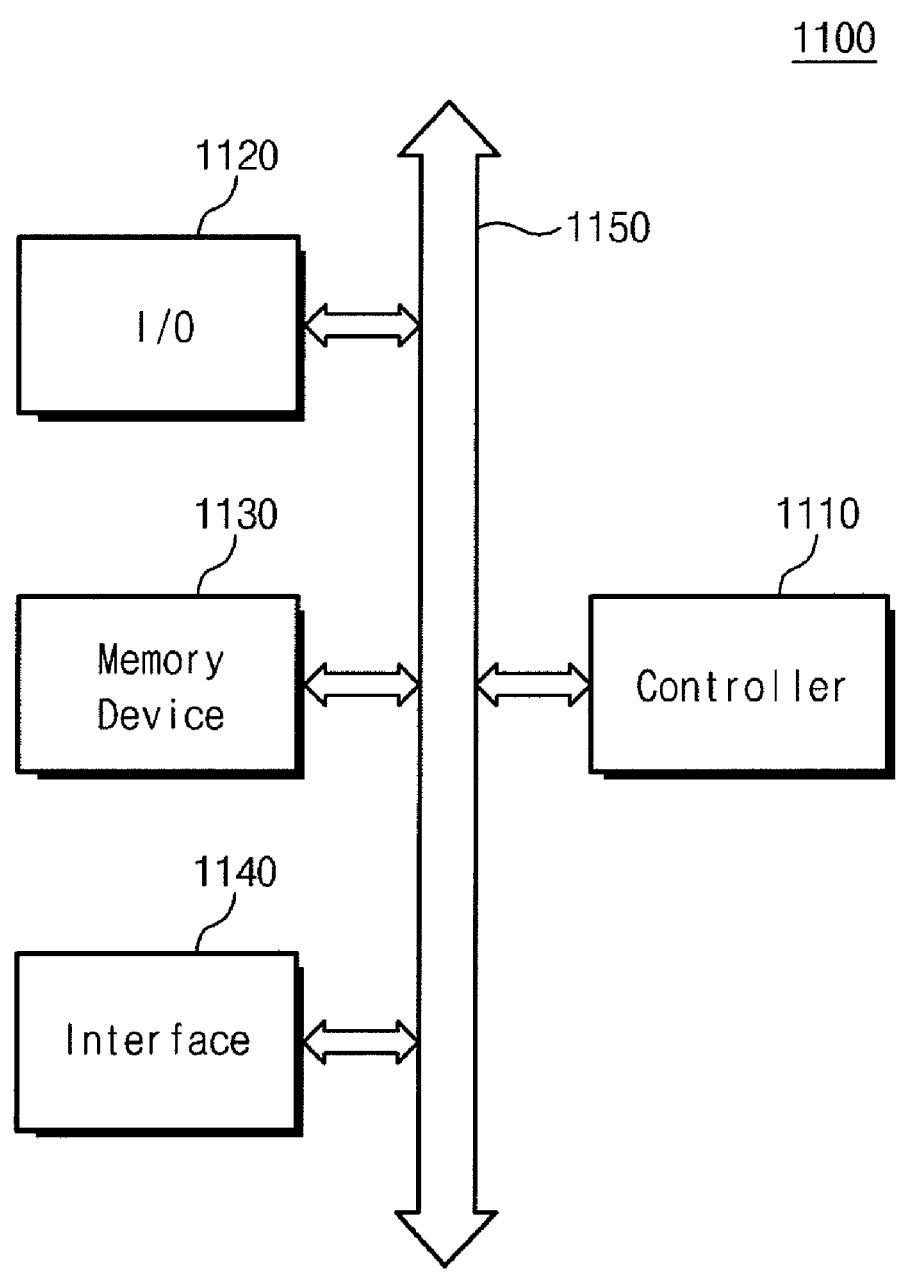
FIG. 12 is a block diagram of an electronic system including the semiconductor memory device according to one embodiment of the inventive concept.

FIG. 12 is a block diagram illustrating an electronic system including the semiconductor memory device according to one embodiment of the inventive concept.

Referring to FIG. 12, an electronic system 1100 according to one embodiment of the inventive concept may include a controller 1110, an input/output device (I/O) 1120, a memory device 1130, an interface 1140, and a bus 1150. The controller 1110, the input/output device (I/O) 1120, the memory device 1130, and/or the interface 1140 may be coupled to each other through the bus 1150. The bus 1150 may be a transfer path of data.

The controller 1110 includes at least one microprocessor, digital signal processor, microcontroller, and logic device executing similar functions thereof. The I/O device 1120 may include a key pad, a keyboard, or a display device. The memory device 1130 may include the three-dimensional memory device disclosed in the above-described embodiments of the inventive concept. The memory device 1130 may include at least one semiconductor memory device according to some embodiments of the inventive concept described with reference to FIGS. 2, 3A through 3D, 4A, 4B, and 5. The memory device 1130 may further include other types of semiconductor memory devices (for example, a DRAM device and/or an SRAM device). The interface 1140 executes a function of transmitting data to a communication network or receiving data from a communication network. The interface 1140 may be in the form of wire or wireless. For example, the interface 1140 may include an antenna or a wireless/wire transceiver. Even though not illustrated, the electronic system 1100 may be an operational memory device for improving the operation of the controller 1110 and may further include a high-speed DRAM device and/or a high-speed SRAM device.

The electronic system 1100 may be applicable to a personal digital assistant (PDA), a portable computer, a web tablet, a wireless phone, a mobile phone, a digital music player, a memory card, or the electronic equipment capable of transmitting and/or receiving information in a wired or wireless environment.

Figure 13:
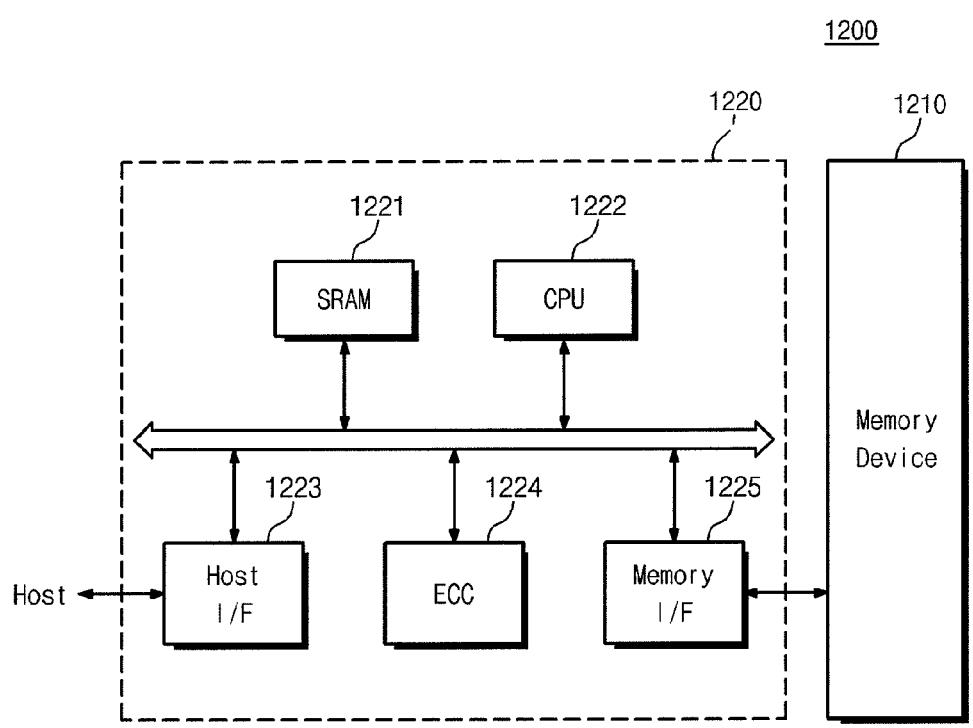
FIG. 13 is a block diagram illustrating a memory card including the semiconductor memory device according to one embodiment of the inventive concept.

FIG. 13 is a block diagram illustrating a memory card including the semiconductor memory device according to one embodiment of the inventive concept.

Referring to FIG. 13, a memory card 1200 according to an embodiment of the inventive concept includes a memory device 1210. The memory device 1210 may include at least one semiconductor memory device according to some embodiments of the inventive concept described with reference to FIGS. 2, 3A through 3D, 4A, 4B, and 5. The memory device 1210 may further include other types of semiconductor memory devices (for example, a DRAM device and/or an SRAM device). The memory card 1200 may include a memory controller 1220 controlling data exchange between a host and the memory device 1210.

The memory controller 1220 may include a processing unit 1222 generally controlling the memory card. The memory controller 1220 may include an SRAM 1221 used as an operational memory of the processing unit 1222. The memory controller 1220 may further include a host interface 1223 and a memory interface 1225. The host interface 1223 may have a protocol for exchanging data between the memory card 1200 and a host. The memory interface 1225 may make the connection between the memory controller 1220 and the memory device 1210. The memory controller 1220 may further include an error correction coding block (ECC) 1224. The error correction coding block 1224 may detect and correct an error of data read from the memory device 1210. Even though not illustrated, the memory card 1200 may further include a ROM device storing code data used to interface a host. The memory card 1200 may be used as a portable data storing card. Alternatively, the memory card 1200 may be realized as a solid state disk (SSD) replacing a hard disk drive of a computer system.

According to some embodiments of the inventive concept, the first wordline channel pillar penetrates the gate of the first wordline transistor, and the bitline channel pillar penetrates the gate of the bitline transistor. Accordingly, the first wordline transistor and the bitline transistor may have a vertical channel to select the first memory cell formed at the intersection between the first local wordline and the vertical local bitline. As a result, the planar region of the first wordline transistor and the bitline transistor may be reduced, thereby realizing the highly-integrated semiconductor memory device.

In addition, according to one embodiment of the inventive concept, since the gate of the bitline transistor may be coupled to the gate of the first wordline transistor, the gate of the first wordline transistor and the gate of the bitline transistor can be controlled by one block selection signal. This can realize the semiconductor memory device which may be improved in operational efficiency.

Reference throughout this specification to "one embodiment" "some embodiments" or "an embodiment" means that a particular feature, structure, or characteristic described in connection with the embodiment is included in at least one embodiment of the present invention. Thus, the appearances of the phrases "in one embodiment," "some embodiments," or "in an embodiment" in various places throughout this specification are not necessarily all referring to the same embodiment. Furthermore, the particular features, structures, or characteristics may be combined in any suitable manner in one or more embodiments.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Various operations will be described as multiple discrete steps performed in a manner that is most helpful in understanding the invention. However, the order in which the steps are described does not imply that the operations are order-dependent or that the order that steps are performed must be the order in which the steps are presented. The above-disclosed subject matter is to be considered illustrative and not restrictive, and the appended claims are intended to cover all such modifications, enhancements, and other embodiments, which fall within the true spirit and scope of the inventive concept is to be determined by the broadest permissible interpretation of the following claims and their equivalents, and shall not be restricted or limited by the foregoing detailed description.

What is claimed is:

1. A semiconductor memory device comprising:
a gate of a first wordline transistor disposed in a first region of a semiconductor substrate;
a gate of a bitline transistor disposed in a second region of the semiconductor substrate;
at least one first wordline channel pillar penetrating the gate of the first wordline transistor and insulated from the gate of the first wordline transistor;
at least one bitline channel pillar penetrating the gate of the bitline transistor and insulated from the gate of the bitline transistor;
a local bitline extending in a first direction substantially vertical to an upper surface of the semiconductor substrate and electrically connected to the bitline channel pillar;
a first local wordline disposed at one side of the local bitline, extending in a second direction substantially perpendicular to the first direction so as to intersect the local bitline, and electrically connected to the first wordline channel pillar; and
a first memory cell formed at an intersection between the local bitline and the first local wordline.

2. The semiconductor memory device of claim 1, wherein the gate of the bitline transistor is coupled to the gate of the first wordline transistor, such that the gate of the bitline transistor and the gate of the first wordline transistor are controlled by a single block selection signal.

3. The semiconductor memory device of claim 1, further comprising:
a gate of a bias transistor disposed in the first region;
at least one bias channel pillar penetrating the gate of the bias transistor and insulated from the gate of the bias transistor; and
a bias line coupled to the bias channel pillar.

4. The semiconductor memory device of claim 3, wherein the gate of the bias transistor is coupled to the gate of the first wordline transistor, and
the gate of the bitline transistor is electrically connected to the bias channel pillar.

5. The semiconductor memory device of claim 3, wherein the bias line is formed in a bias active portion defined in the semiconductor substrate below the gate of the bias transistor and the bias line is doped with dopants.

6. The semiconductor memory device of claim 1, wherein the at least one first wordline channel pillar and/or the at least one bitline channel pillar are substantially undoped.

7. The semiconductor memory device of claim 1, further comprising:
a gate of a second wordline transistor disposed in the first region;
at least one second wordline channel pillar penetrating the gate of the second wordline transistor and insulated from the gate of the second wordline transistor;
a second local wordline disposed at the other side of the local bitline in the second region, extending in the second direction to intersect the local bitline, and electrically connected to the second wordline channel pillar; and
a second memory cell formed at an intersection between the local bitline and the second local wordline,
wherein the gate of the first wordline transistor is coupled to the gate of the second wordline transistor.

8. The semiconductor memory device of claim 7, further comprising:
a first global wordline coupled to the first wordline channel pillar;
a second global wordline coupled to the second wordline channel pillar; and
a global bitline coupled to the bitline channel pillar.

9. The semiconductor memory device of claim 8, wherein the at least one first wordline channel pillar and/or the at least one bitline channel pillar are doped with a first dopant different from a second dopant in the first global wordline, the second global wordline and/or the global bitline.

10. The semiconductor memory device of claim 8, wherein the first global wordline is formed in a first wordline active portion defined in the semiconductor substrate below the gate of the first wordline transistor,
the second global wordline is formed in a second wordline active portion defined in the semiconductor substrate below the gate of the second wordline transistor, and
the global bitline is formed in a bitline active portion defined in the semiconductor substrate below the gate of the bitline transistor.

11. The semiconductor memory device of claim 7, wherein the first and second local wordlines are located at substantially the same level.

12. The semiconductor memory device of claim 7, wherein the first memory cell includes a first variable resistor interposed between the first local wordline and the local bitline.

13. The semiconductor memory device of claim 12, wherein
the second memory cell includes a second variable resistor interposed between the second local wordline and the local bitline.

14. The semiconductor memory device of claim 7, further comprising:
a gate of a block selection transistor disposed in the first region and spaced apart from the gates of the first and second wordline transistors;
at least one block selection channel pillar penetrating the gate of the block selection transistor and insulated from the gate of the block selection transistor; and
a block selection signal line electrically connected to the block selection channel pillar,
wherein the block selection channel pillar is electrically connected to the gates of the first and second wordline transistors, which are coupled to each other.

15. The semiconductor memory device of claim 7, wherein the first local wordline comprises a plurality of first local wordlines and the second local wordline comprises a plurality of second local wordlines,
wherein the first local wordlines are stacked on one side of the local bitline so as to be spaced apart from one another in the first direction,
wherein the second local wordlines are stacked on the other side of the local bitline so as to be spaced apart from one another in the first direction,
wherein the first wordline transistor comprises a plurality of first wordline transistors in the first region and the second wordline transistor comprises a plurality of second wordline transistors in the first region,
wherein the gates of the first wordline transistors and the gates of the second wordline transistors are alternately disposed along the second direction in the first region,
wherein each of the first local wordlines is electrically connected to the first wordline channel pillar penetrating the gate of the first wordline transistors,
wherein each of the second local wordlines is electrically connected to the second wordline channel pillar penetrating the gate of the second wordline transistors, and wherein the gates of the first wordline transistors and the gates of the second wordline transistors are coupled to each other.

16. A semiconductor memory device comprising:
a gate of a wordline transistor disposed on a semiconductor substrate;
a gate of a bitline transistor disposed on the semiconductor substrate;
at least one wordline channel pillar penetrating the gate of the wordline transistor and insulated from the gate of the wordline transistor;
at least one bitline channel pillar penetrating the gate of the bitline transistor and insulated from the gate of the bitline transistor;
a local bitline extending in a first direction and electrically connected to the bitline channel pillar; and
a local wordline disposed at one side of the local bitline, extending in a second direction different from the first direction so as to intersect the local bitline, and electrically connected to the wordline channel pillar.

17. The semiconductor memory device of claim 16, wherein the local wordline extends in the second direction substantially perpendicular to the first direction.

18. A system comprising:
a semiconductor device comprising:
a gate of a wordline transistor disposed on a semiconductor substrate;
a gate of a bitline transistor disposed on the semiconductor substrate;
at least one wordline channel pillar penetrating the gate of the wordline transistor and insulated from the gate of the wordline transistor;
at least one bitline channel pillar penetrating the gate of the bitline transistor and insulated from the gate of the bitline transistor;
a local bitline extending in a first direction and electrically connected to the bitline channel pillar; and
a local wordline disposed at one side of the local bitline, extending in a second direction different from the first direction so as to intersect the local bitline, and electrically connected to the wordline channel pillar; and
a CPU or a controller coupled to the semiconductor device.

* * * * *